(12) United States Patent
Goldberg et al.

(10) Patent No.: US 9,996,904 B2
(45) Date of Patent: *Jun. 12, 2018

(54) INTELLIGENT IMAGE PROCESSING FOR ENTERPRISE APPLICATIONS

(71) Applicant: Oracle International Corporation, Redwood Shores, CA (US)

(72) Inventors: Joseph Goldberg, San Carlos, CA (US); Mark Vilrokx, San Mateo, CA (US); Aylin Uysal, San Francisco, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/476,892

(22) Filed: Mar. 31, 2017

(65) Prior Publication Data

US 2017/0206634 A1 Jul. 20, 2017

Related U.S. Application Data

(63) Continuation of application No. 14/317,945, filed on Jun. 27, 2014, now Pat. No. 9,646,131.

(51) Int. Cl.
*G06K 9/32* (2006.01)
*G06T 3/40* (2006.01)
(Continued)

(52) U.S. Cl.
CPC ............ *G06T 3/4092* (2013.01); *G06F 17/50* (2013.01); *G06Q 10/10* (2013.01); *G06T 3/20* (2013.01);
(Continued)

(58) Field of Classification Search
CPC ................... G06T 2207/20132; G06T 7/0081
See application file for complete search history.

(56) References Cited

U.S. PATENT DOCUMENTS 6,351,295 B2    2/2002 Bulman
9,646,131 B2 *  5/2017 Goldberg ............... G06Q 10/10
(Continued)

OTHER PUBLICATIONS

Bioid (personal recognition service), [retrieved on Jun. 26, 2014], retrieved from the internet: <URL:http://www.bioid.com/>, 2014, 2 pages.
(Continued)

*Primary Examiner* — Phuoc Tran
(74) *Attorney, Agent, or Firm* — Kilpatrick Townsend & Stockton LLP

(57) ABSTRACT

Techniques are described for processing an electronic image for presentation in a display of an enterprise application according to a format for presenting electronic image in the enterprise application. A format for an enterprise application may indicate display attributes such as an aspect ratio, a frame size, a resolution, or the like. The format for presenting an electronic image may correspond to a type of an enterprise application, a function of an enterprise application, a feature of an enterprise application, one or more subjects of the electronic image, other criteria associated with an enterprise application, or a combination thereof. These techniques may enable an electronic image to be adjusted for presentation in enterprise applications that have different formats. Users may benefit by not having to provide an electronic image adjusted to the different formats, thereby enabling a single electronic image to be used for a variety of enterprise applications.

20 Claims, 13 Drawing Sheets

(51) Int. Cl.
*G06T 3/20* (2006.01)
*G06Q 10/10* (2012.01)
*G06F 17/50* (2006.01)

(52) U.S. Cl.
CPC ...... *G06T 3/40* (2013.01); *G06T 2207/20132* (2013.01)

(56) References Cited

U.S. PATENT DOCUMENTS

| | | | |
|---|---|---|---|
| 2010/0257481 | A1 | 10/2010 | Clarke |
| 2014/0270533 | A1 | 9/2014 | Chedeau |
| 2015/0019545 | A1 | 1/2015 | Chedeau et al. |
| 2015/0054853 | A1 | 2/2015 | Georgiev |
| 2015/0379722 | A1 | 12/2015 | Goldberg et al. |

OTHER PUBLICATIONS

CloudCV: Object Detection, retrieved from the internet: http://cloudcv.org/objdetect/, retrieved on Nov. 23, 2016, 6 pages.
Cloudinary (image management), [retrieved on Jun. 26, 2014], retrieved from the internet: <URL:http://cloudinary.com/features>, 2014, 15 pages.
Croply (image cropping service), [retrieved on Jun. 26, 2014], retrieved from the internet: <URL:http://croply.com/>, 2014, 1 page.
Cropp.me (image cropping service), [retrieved on Jun. 26, 2014], retrieved from the internet: <URL:http://cropp.me/>, 2014, 4 pages.
Cut My Picl (Image cropping service), [retieved on Jun. 26, 2014], retrieved from the internet : <URL:http://www.cutmypic.com/cmpmedia>, 2014, 3 pages.
Face Detection and Recognition SDK, Betaface, [online], 2014, [retrieved on Jun. 26, 2014], retrieved from the internet: <URL:http://betaface.com/wpa/index.php/products>, 2014, 2 pages.
Facial Recognition App., retrieved from the internet: https://www.facebook.com/pages/Facial-Recognition-App/159438437451817, 2010, 11 pages.
Future uses for facial recognition technology, retrieved from the internet: http://www.cbsnews.com/videos/future-uses-for-facial-recognition-technology/, Jan. 17, 2015, 2 pages.
Getting Started Overview, Vuforia Developer Portal, [online], 2014, [retrieved on Jun. 26, 2014], retrieved from the internet: <URL: https://developer.vuforia.com/getting-started-overview>, 2014, 2 pages.
Google Prediction API, Google Developers, [online], 2014, [retrieved on Jun. 26, 2014], retrieved from the internet: <URL:https://developers.google.com/prediction/>, 2014, 2 pages.
I need to resize my profile picture to fit more than just my face, Answers Salesforce Success, [online], Nov. 27, 2012, [retrieved on Jun. 26, 2014], retrieved from the internet: <URL:https://success.salesforce.com/answersid=90630000000gjldAAA>, Nov. 27, 2012, 2 pages.
Image Cropping/Resizing Solution, Salesforce Stack Exchange, [online], Dec. 21, 2012, [retrieved on Jun. 26, 2014], retrieved from the internet <URL: http://salesforce.stackexchange.com/questions/5663/image-croppingresizing-solution,>, Dec. 21, 2012, 1 page.
Imgix (image cropping service), [retrieved on Jun. 26, 2014], retrieved from the internet: <URL:http://www.imgix.com/docs>, 2014, 3 pages.
Loading and Saving Images Tutorial, Simple CV, [online], 2014, [retrieved on Jun. 26, 2014], retrieved from the internet <URL:http://tutorial.simplecv.org/en/latest/examples/basics.html>, 2014, 6 pages.
Open CV (public access forum), [retrieved on Jun. 26, 2014], retrieved from the internet: <URL:http://opencv.org/>, 2014, 3 pages.
PICSLICE (image cropping service), [retrieved on Jun. 26, 2014], retrieved from the internet: <URL:http://picslice.com/>, 2014, 2 pages.
Profile Photo Upload, SAP Help Portal, [online], Jun. 15, 2013, [retrieved on Jun. 26, 2014], retrieved from the internet : <URL:http://scn.sap.com/thread/3375640>, Jun. 15, 2013, 2 pages.
Programming Computer Vision with Python, retrieved from the internet: http://programmingcomputervision.com/, Mar. 18, 2012. 1 page.
Tin Eye Services, [retrieved on Jun. 26, 2014], retrieved from the internet: <URL:http://services.tineye.com/>, 2014, 3 pages.
Anthony, Facebook's facial recognition software is now as accurate as the human brain, but what now, retrieved from the internet: https://www.extremetech.com/extreme/178777-facebooks-facial-recognition-software-is-now-as-accurate-as-the-human-brain-but-what-now, Mar. 19, 2014, 7 pages.
Barak, Facial Recognition apps; creepy or cool, https://web.archive.org/web/20120517112104/http://unplugged.rcrwireless.com/index.php/20110503/devices/8797/facial-recognition-apps-creepy-or-cool, May 3, 2011, 5 pages.
Brunhuber, Facial recognition tech is allowing stores to reward customers, retrieved from the internet: http://www.cbc.ca/news/technology/facial-recognition-shopping-1 3561060, May 2, 2016, 4 pages.
Cohen, Facebook Quietly Brings Back Tag Suggest in Europe, But It Only Works on U.S. Users, retrieved from the internet: http://www.adweek.com/socialtimes/author/davidcohen, Sep. 2, 2014, 7 pages.
Demaagd et al., Practical Computer Vision with SimpleCV O'Reilly Media, Inc., 2012, 1 page.
D'Onfro, Here's everything you need to know about Apple's best iPhone camera yet, Apple iPhone 6S and 6S Plus camera details—Business Insider, Sep. 9, 2015, 10 pages.
Dove, FotoTiger facial recognition app for Android puts the "Who" in your photos, retrieved from the internet: http://thenextweb.com/apps/2014/11/18/fototiger-facial-recognition-app-android-puts-photos/, Nov. 18, 2014, 4 pages.
Ehley, FBI's Billion Dollar Facial Recognition Falls Short of Facebook's, retrieved from the internet: http://finance.yahoo.com/news/fbi-billion-dollar-facial-recognition-091500415.html, Jul. 11, 2014, 9 pages.
Etherington, Apple Patents Face Recognition Tech For Enhanced iPhone Privacy And Automated Controls, retrieved from the internet: https://techcrunch.com/2013/12/03/apple-patents-face-recogniton/, Dec. 3, 2013, 13 pages.
Franco, How to break a patent in 5 minutes, Anthony's Blog, [online], Jan. 22, 2010, [retrieved on Mar. 24, 2014], retrieved from the internet: <URL: http://anthonyfranco.word press.com/2010/01/22/how-to-break-a-patent-in-5-minutes/>, Jan. 22, 2010, 9 pages.
Grens, Forget the doctor, ask your PCI, retrieved from the internet: http://www.w24.co.za/Wellness/Mind/Forget-the-doctorask-your-PC-20110510, May 10, 2011, 3 pages.
Howse, OpenCV Computer Vision with Python, retrieved from the internet: https://www.packtpub.com/application-development/opencv-computer-vision-python, Apr. 2013, 3 pages.
Jozuka, Glasses That Confuse Facial Recognition Systems Are Coming to Japan, retrieved from the internet: http://motherboard.vice.com/read/glasses-that-confuse-facial-recognition-systems-are-coming-to-japan, Aug. 7, 2015, 9 pages.
McCarthy, Facebook facial recognition tech helps parents control who is sharing pics of their children, retrieved from the internet: http://www.thedrum.com/news/2015/11/13/facebook-facial-recog-nition-tech-helps-parents-control-who-sharing-pics-their, Nov. 13, 2015, 6 pages.
Pooiee, Finding Rover: The app using facial recognition software to find lost dogs—Techly, retrieved from the internet: http://www.techly.com.au/2014/08/23/finding-rover-allows-use-facial-recogni-tion-find-lost-dogs/, Aug. 22, 2014 6 pages.
Temelkov, Why Facial Recognition Will Change Marketing Forever, retrieved from the internet: http://curatti.com/facial-recogni-tion/, Copyright © 2016, 5 pages.
Thompson, Usher's new music video uses facial recognition technology to make sure you're paying attention to its message, http://www.businessinsider.com/usher-music-video-uses-facial-recogni-tion-2015-10, Oct. 23, 2015, 4 pages.

(56) References Cited

OTHER PUBLICATIONS

U.S Appl. No. 14/317,945, Non-Final Office Action dated Mar. 15, 2016, 8 pages.
U.S Appl. No. 14/317,945, Notice of Allowance dated Aug. 29, 2016, 5 pages.
U.S Appl. No. 14/317,945, Notice of Allowance dated Dec. 16, 2016, 5 pages.

* cited by examiner

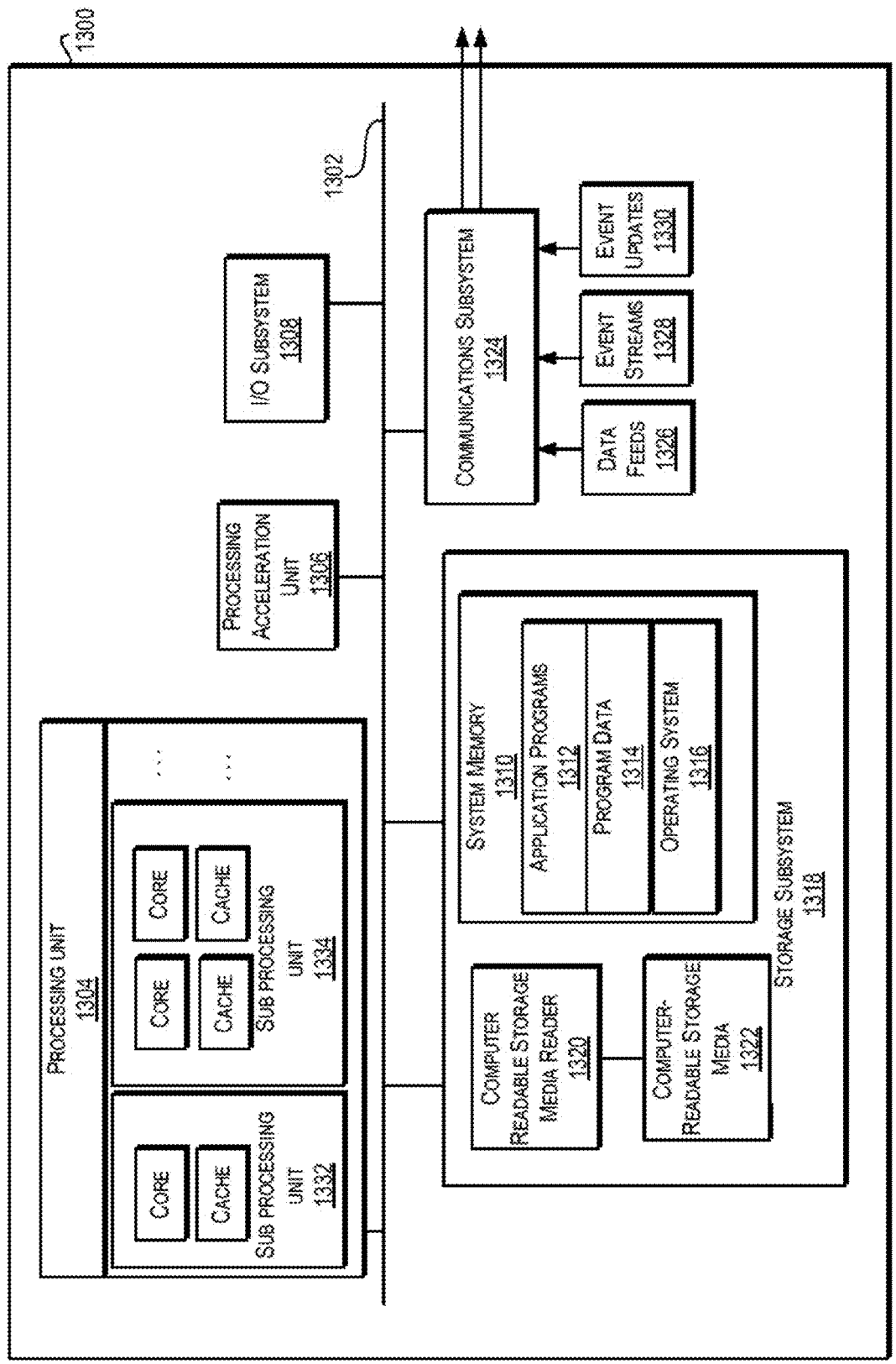

INTELLIGENT IMAGE PROCESSING FOR ENTERPRISE APPLICATIONS

CROSS-REFERENCES TO RELATED APPLICATIONS

This application is a continuation of, and claims the benefit and priority of U.S. Non-Provisional patent application Ser. No. 14/317,945 entitled "INTELLIGENT IMAGE PROCESSING FOR ENTERPRISE APPLICATIONS" and filed on Jun. 27, 2014. The entire contents of the above-identified patent application is incorporated herein by reference in its entirety.

TECHNICAL FIELD

The present disclosure relates to image processing for enterprise applications. Specifically, various techniques and systems are described for processing an image for display in an enterprise application.

BACKGROUND

Generally, computer software, such as enterprise applications, may be designed for use by organizations (e.g., enterprises), rather than individual users or consumers. Whereas consumer applications (e.g., email applications, social media applications, etc.) may be tailored towards consumer-related services and features, enterprise applications may provide business-oriented features and tools (e.g., employee management, customer relationship management, operations management, inventory management, business procurement, or the like) for management of an enterprise. Among enterprise applications, information may be presented in many different formats, often times to serve a diverse audience of user roles. For example, an enterprise application for employee management may provide information about employees in an organization. The information about employees may be presented in different formats. In another example, an enterprise application may present information about different items in a business's inventory. In each case, the format for presenting electronic images may vary to optimally serve the needs of particular user roles.

Often times, an original format of the electronic images presented in an enterprise application may have attributes that match a format (e.g., aspect ratio, frame size, resolution, or the like) by which the application presents electronic image. In some cases, when electronic images are presented in their original format, the person, place, or object in the electronic images may not be adequately formatted or may not appear distinguishable by a person when displayed by the enterprise application. As such, users of enterprise applications may be burdened by having to modify electronic images to satisfy the criteria of different enterprise applications. Providers of enterprise applications may be equally challenged by having to present electronic images that can be formatted according to the criteria of each enterprise application. For example, an enterprise user might upload an image that is in a 4:3 aspect ratio, when the application requires the image to be in a 6:4 aspect ratio.

BRIEF SUMMARY

Techniques are described for processing an electronic image for presentation in a display of an enterprise application according to a format for presenting electronic images in the enterprise application. A format for an enterprise application may indicate display attributes such as an aspect ratio, a frame size, a resolution, or the like. The format for presenting an electronic image may correspond to a type of an enterprise application, a function of an enterprise application, a feature of an enterprise application, one or more subjects of the electronic image, other criteria associated with an enterprise application, or a combination thereof. The techniques may enable an electronic image to be adjusted for presentation in enterprise applications that have different formats. Users may benefit by not having to provide an electronic image adjusted to the different formats, thereby enabling a single electronic image to be used for a variety of enterprise applications. Although techniques disclosed herein may be described as being performed for enterprise applications, may be implemented for other types of computing applications, which display images.

In some embodiments, the original electronic image may be adjusted by cropping content in the electronic image. An electronic image may be cropped to extract a portion of the content in the electronic image related to a person, place, or object in the image. For example, an electronic image of a person may be cropped to obtain the content associated with the person and to remove a portion of the background in the electronic image. While cropping the original electronic image, the attributes of the original electronic image may be maintained to prevent impairment or distortion of the content in the cropped electronic image, such that the content, when rendered, may not be adequately formatted or may not appear distinguishable. Various methods may be employed to remove or crop content from an electronic image. Such methods may be implemented using image processing services, processing libraries (e.g., OpenCV and SimpleCV), image processing techniques, or a combination thereof. In some embodiments, image classifiers (e.g., facial classifiers and Haar classifiers) or object classifiers may be used to recognize content presented by an electronic image, such as a person, place, or object in an electronic image. The recognized content may be cropped from an original electronic image.

An electronic image may be adjusted to satisfy the attributes of a format for presenting electronic images in an enterprise application. In some embodiments, an electronic image may be adjusted for a frame size corresponding to a format of an enterprise application while enabling other attributes of the image to remain unchanged. For example, a cropped electronic image may be resized to a different frame size to satisfy a format for an application, while an aspect ratio of the image may remain unchanged. In some embodiments, an electronic image may be scaled such that its frame size and its aspect ratio are both adjusted to satisfy a format. The electronic image can be adjusted in a variety of ways including adjustments to attributes that may satisfy a format of an enterprise application. Such techniques for adjustment of an electronic image may be implemented using image processing services, processing libraries (e.g., OpenCV and SimpleCV), image processing techniques, or a combination thereof. In some embodiments, an electronic image may be cropped to remove multiple portions of an original electronic image for presentation in an enterprise application. For example, an electronic image of a group of people may be cropped to extract a cropped electronic image of each person. Each of the cropped images may be adjusted for individual presentation in an application.

Techniques for adjusting an electronic image according to a format for an enterprise application may reduce a burden on users and providers of the enterprise application to produce different images for different enterprise applications. For example, in business applications (e.g., inventor management or employee management) that may present many images, the techniques disclosed herein may enable a single electronic image including content of different people, places, and/or objects to be adjusted and presented according to different formats. Changes in a manner of presentation or an application environment may be accommodated accordingly to adjustments satisfying criteria and/or format for presentation. Processing may be reduced by storing adjusted electronic images in different formats so that they may be retrieved for subsequent presentation according to one or more attributes of the stored images.

According to at least one example, techniques may be provided that can be implemented by a computing system or a computing device. The computing system may include one or more processors and one or more memory devices coupled with and readable by one or more processors. The one or more memory devices may store a set of instructions which, when executed by the one or more processors, cause the one or more processors to perform the techniques disclosed herein. The techniques can include a computer-implemented method, which includes receiving a request to operate an enterprise application of a plurality of enterprise applications. Each of the plurality of enterprise applications may be associated with criteria for presenting an electronic image in the corresponding enterprise application. The method further includes receiving an original electronic image to present in the requested enterprise application. The method further includes determining an adjustment of the original electronic image for presentation in the requested enterprise application. The adjustment may be determined using criteria associated with the requested enterprise application. The method further includes generating an adjusted electronic image to present in the requested enterprise application. The adjusted electronic image may be generated using the determined adjustment. The method further includes enabling presentation of the adjusted electronic image in the requested enterprise application during operation of the requested enterprise application.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The following detailed description together with the accompanying drawings will provide a better understanding of the nature and advantages of the present invention.

BRIEF DESCRIPTION OF THE DRAWINGS

Illustrative embodiments of the present invention are described in detail below with reference to the following drawing figures:

FIG. 13 illustrates an exemplary computer system, in which various embodiments of the present invention may be implemented.

DETAILED DESCRIPTION

Figure 1:
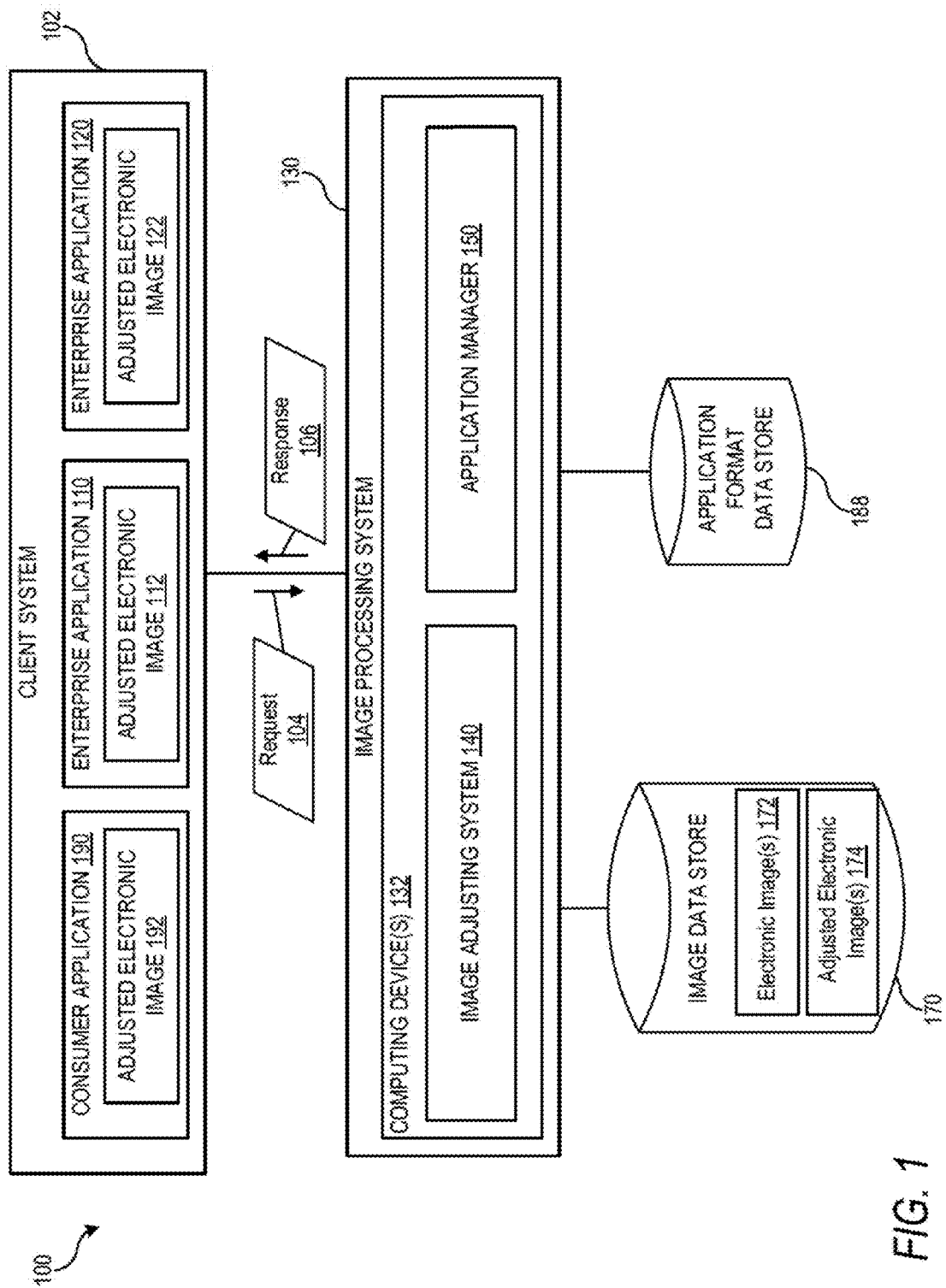
FIG. 1 shows a block diagram of a computing system that can perform intelligent image processing for enterprise applications according to some embodiments of the present invention.

In the following description, for the purposes of explanation, numerous specific details are set forth in order to provide a thorough understanding of various embodiments of the present invention. It will be apparent, however, to one skilled in the art that embodiments of the present invention may be practiced without some of these specific details. In other instances, well-known structures and devices are shown in block diagram form.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "machine-readable storage medium" includes, but is not limited to, portable or non-portable storage devices, optical storage devices, and various other mediums capable of storing, containing, or carrying instruction(s) and/or data. A machine-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

Systems depicted in some of the figures may be provided in various configurations. In some embodiments, the systems may be configured as a distributed system where one or more components of the system are distributed across one or more networks in a cloud computing system.

Techniques are described for processing an electronic image for presentation in a display of an enterprise application according to a format for presenting electronic images in the enterprise application. A format for an enterprise application may indicate display attributes such as an aspect ratio, a frame size, a resolution, or the like. The format for presenting an electronic image may correspond to a type of an enterprise application, a function of an enterprise application, a feature of an enterprise application, one or more subjects of the electronic image, other criteria associated with an enterprise application, or a combination thereof. The techniques may enable an electronic image to be adjusted for presentation in enterprise applications that have different formats. Users may benefit by not having to provide an electronic image adjusted to the different formats, thereby enabling a single electronic image to be used for a variety of enterprise applications. Although techniques disclosed herein may be described as being performed for enterprise applications, may be implemented for other types of computing applications, which display images.

In some embodiments, the original electronic image may be adjusted by cropping content in the electronic image. An electronic image may be cropped to extract a portion of the content in the electronic image related to a person, place, or object in the image. For example, an electronic image of a person may be cropped to obtain the content associated with the person and to remove a portion of the background in the electronic image. While cropping the original electronic image, the attributes of the original electronic image may be maintained to prevent impairment or distortion of the content in the cropped electronic image, such that the content, when rendered, may not be adequately formatted or may not appear distinguishable. Various methods may be employed to remove or crop content from an electronic image. Such methods may be implemented using image processing services, processing libraries (e.g., OpenCV and SimpleCV), image processing techniques, or a combination thereof. In some embodiments, image classifiers (e.g., facial classifiers and Haar classifiers) or object classifiers may be used to recognize content presented by an electronic image, such as a person, place, or object in an electronic image. The recognized content may be cropped from an original electronic image.

An electronic image may be adjusted to satisfy the attributes of a format for presenting electronic images in an enterprise application. In some embodiments, an electronic image may be adjusted for a frame size corresponding to a format of an enterprise application while enabling other attributes of the image to remain unchanged. For example, a cropped electronic image may be resized to a different frame size to satisfy a format for an application, while an aspect ratio of the image may remain unchanged. In some embodiments, an electronic image may be scaled such that its frame size and its aspect ratio are both adjusted to satisfy a format. The electronic image can be adjusted in a variety of ways including adjustments to attributes that may satisfy a format of an enterprise application. Such techniques for adjustment of an electronic image may be implemented using image processing services, processing libraries (e.g., OpenCV and SimpleCV), image processing techniques, or a combination thereof. Image processing services may include, for example, Vuforia™ (a service of Qualcomm, Inc.) or TinEye™ (a service of Idée Inc.). In some embodiments, an electronic image may be cropped to remove multiple portions of an original electronic image for presentation in an enterprise application. For example, an electronic image of a group of people may be cropped to extract a cropped electronic image of each person. Each of the cropped images may be adjusted for individual presentation in an application.

Techniques for adjusting an electronic image according to a format for an enterprise application may reduce a burden on users and providers of the enterprise application to produce different images for different enterprise applications. For example, in business applications (e.g., inventor management or employee management) that may present many images, the techniques disclosed herein may enable a single electronic image including content of different people, places, and/or objects to be adjusted and presented according to different formats. Changes in a manner of presentation or an application environment may be accommodated accordingly to adjustments satisfying criteria and/or format for presentation. Processing may be reduced by storing adjusted electronic images in different formats so that they may be retrieved for subsequent presentation according to one or more attributes of the stored images.

FIG. 1 shows a block diagram of a computing system 100 that can perform intelligent image processing for enterprise application according to one embodiment of the present invention. Specifically, the computing system 100 may determine a format for presenting electronic images in an enterprise application and can perform image processing with respect to electronic images to enable presentation of the image in the application corresponding to the format.

As disclosed herein, an electronic image (e.g., a digital image) may include data (e.g., numeric data) representing a multi-dimensional (e.g., two-dimensional) image. An image may represent an artifact (e.g., a photograph) that depicts or visually renders, among others, a subject including one or more of any of the following: a physical object, an environment, a place or location, a person, and/or a living thing (e.g., a domestic animal, a wild animal, or the like). A physical object may include a good (e.g., an item of manufacture), a physical structure (e.g., a building or a room), or other tangible physical object. For purposes of illustration, specific embodiments are described herein for techniques for intelligent processing of images of people. Some embodiments, although described as being performed using images of people, may be performed using electronic images of an artifact related to any subject matter. The intelligent image processing techniques disclosed herein enable dynamic presentation of electronic images in computer software applications such that they can be rendered or visually perceived by a person.

For purposes of illustration, various examples are provided herein to describe techniques for image processing to present electronic images in different types of enterprise applications. Presenting a single electronic image (e.g., an original electronic image) in different enterprise applications according to a different format may pose challenges. In some instances, attributes (e.g., aspect ratio, frame size, or the like) of an electronic image may not meet the attributes of a format (e.g., criteria) for presenting the electronic image in an enterprise application. Different applications may present an electronic image differently, each application supporting a format that has certain attributes, e.g., a frame size and aspect ratio. For example, one enterprise application for presenting an employee profile may have a format for presenting an original electronic image of a person in the profile, and another enterprise application for an employee directory may have a different format for presenting the original electronic image of the person. Although the present disclosure describes presentation of electronic images and applications, such descriptions are meant to include displaying or rendering of the electronic images and applications.

The attributes in a format for presenting an electronic image in an enterprise application can be based on criteria, which may vary between different enterprise applications that may be presenting the same electronic image. The attributes of a format may correspond to a type of function or feature provided by an enterprise application and/or a type of the enterprise application in which the electronic image is shown. The attributes may include criteria indicating a manner (e.g., a format) for displaying the electronic images to prevent or reduce rendering or perception of the electronic images during their presentation. For instance, the criteria may be based on factors such as a type of electronic image to be displayed in the application and/or a type of the application. Because of these differences, among others, an electronic image presented as is within an enterprise application without further image processing may appear different, often times rendered improperly or unable to be perceived in some enterprise applications. As a result, a subject or the electronic images may not be adequately formatted or may not appear distinguishable.

Some examples including those in FIGS. 3-9 will be illustrated and described below to show ways in which an original electronic image may be processed to be presented in different enterprise applications according to different formats. Electronic images can be dynamically adjusted for presentation such that they may be rendered or visually perceived in an enterprise application consistent with attributes of a format for the enterprise application. An electronic image may be adjusted accordingly for an enterprise application to prevent a quality of the electronic image from being lost due to incompatibility with the format corresponding to an enterprise application. Although examples are described with reference to enterprise applications, the disclosed techniques may be equally applied to consumer applications that may vary in the attributes and/or criteria for presenting electronic images. The techniques for image processing disclosed herein may be useful for enhancing image processing for consumer applications that have different requirements for presenting electronic images.

Now turning to FIG. 1, the computing system 100 may include a client system 102 and an image processing system 130. The client system 102 and the image processing system 130 can communicate with each other via a network (not shown). The network can be, for example, the Internet, a mobile network, a wireless network, a cellular network, a local area network (LAN), a wide area network (WAN), other communication networks, or a combination thereof. In some embodiments, the image processing system 130 and the client system 102 may be included in a single computing system. It should be appreciated that various different system configurations are possible, which may be different from the computing system 100.

Some embodiments shown in FIG. 1 are examples of a computing system for implementing an embodiment system and is not intended to be limiting. Techniques disclosed herein, may be performed by the client system 102, the image processing system 130, any other computing system, or a combination thereof. For purposes of illustration, some embodiments are described as being performed by the image processing system 130. The image processing system 130 can process an electronic image (e.g., an original electronic image) to determine an adjustment for adjusting the electronic image for presentation in different enterprise applications. The adjustment may be determined based on attributes corresponding to a format for presenting images in an application. The format for presenting an electronic image may vary between applications. As explained above, the format can be based on content of an electronic image and/or criteria associated with the application for displaying an electronic image. The image processing system 130 may use the adjustment to determine an adjusted electronic image that can be presented in the application instead of an original electronic image.

The client system 102 (e.g., "a client") may be a computing system implemented in hardware, firmware, software, or combinations thereof. A user can operate the client system 102 to communicate a request, e.g., a request 104, to the server computing system 130. The client system 102 can receive responses (e.g., a response 106) from the image processing system 130. The client system 102 can include or be implemented as an endpoint, a personal digital assistant (PDA), a tablet computer, a laptop computer, a desktop computer, a wearable computer, a pager, etc. The client system 102 can include one or more memory storage devices and one or more processors. A memory storage device can be accessible to the processor(s) and can include instructions stored thereon which, when executed by the processor(s), cause the processor(s) to implement one or more operations, methods, or processes disclosed herein. In various embodiments, the client system 102 may be configured to execute and operate one or more applications such as a web browser, a client application, a proprietary client application, or the like. The client applications may be accessible or operated via one or more network(s). In some embodiments, the client system 102 can be associated with or implemented in the image processing system 130.

The image processing system 130 may be a computing system implemented in hardware, firmware, software, or combinations thereof. The image processing system 130 may include one or more memory storage devices and one or more processors. A memory storage device can be accessible to the processor(s) and can include instructions stored thereon which, when executed by the processor(s), cause the processor(s) to implement one or more operations, methods, or processes disclosed herein. For example, the image processing system 130 can include or be implemented as one or more computing devices, such as a computing device 132. The computing device 132 can include one or more of any type of computing device, such as a laptop computer, a desktop computer, a tablet computing device, a server computer, or the like. The computing device 132 can communicate with client systems, e.g., the client system 102, to receive the requests 104 and to provide the responses 106. In various embodiments, the image processing system 130 may be configured to execute and operate one or more applications such as a web browser, a client application, a proprietary client application, or the like. The applications may be accessible or operated via one or more network(s). In some embodiments, the image processing system 130 can be associated with or implemented with the client system 102.

The computing system 100 may enable an electronic image to be adjusted for presentation in different types of applications (e.g., an enterprise application 110, an enterprise application 120, and an consumer application 190) according to each application's respective format for presenting electronic images. Enterprise applications may include, among many others, business applications, security management applications, productivity applications, organization applications, financial management applications, customer relationship management applications, employee management application, inventory management applications, procurement applications, and/or development applications. Consumer applications may include, among many others, game applications, social media applications, news applications, and/or communication applications. One or more adjusted electronic images may be generated by the image processing system 130 by performing processing an electronic image (e.g., an original electronic image). The process of an adjusted electronic image may include determining an adjustment according to a format for presentation by an application. The image processing system 130 can enable the applications 110, 120, 190 to receive the adjusted image for presentation in place of an original electronic image.

One or more of the applications 110, 120, 190 may be running on the client system 102, the image processing system 130, any other computing system, or a combination thereof. In some embodiments, one or more of the applications 110, 120, 190 can be running on an image processing system 130 and can accessed via the client system 102. In the examples shown in FIG. 1, the applications 110, 120, 190 may be running on the client system 102. The client system 102 may be in communication with the image processing system 130.

The client system 102 may communicate a request (e.g., a request 104) to the image processing system 130 to enable an adjustment of an electronic image to be presented by one or more of the applications 110, 120, 190. In some embodiments, the request 104 can be generated by an application for which an electronic image to be displayed. The request 104 can be communicated by the client system 102 to the image processing system 130. The request 104 may include, among other data, an electronic image (e.g., an original electronic image) to be adjusted for an application. The request 104 may indicate that a request has been made to operate an enterprise application, a function of an enterprise application, or a combination thereof. Data included in the request 104 may enable the image processing system 130 to perform process an electronic image to determine an adjustment for adjusting presentation of an electronic image by an application. In some embodiments, the data in the request 104 may indicate criteria to determine a format for presenting an electronic image. The criteria may include a type of an application (e.g., business application, employee management application, customer relationship application, etc.) that has been requested, a function of an application (e.g., profile display, security profile, organization chart, etc.) that has been requested, a format (e.g., frame size, resolution, aspect ratio, or the like) for presenting an electronic image, a subject matter of the electronic image to be adjusted, or a combination thereof. The client system 102 may store a format for each application operated at the client system 102. As such, the client system 102 may provide the format in the request 104.

The image processing system 130 may process an electronic image to generate an adjusted electronic image that can be presented by an application (e.g., the enterprise application 110, the enterprise application 120, and the consumer application 190) according a format supported by the application. As a part of the image processing, the image processing system 130 may determine an adjustment for adjusting an electronic image for presentation in an application. The image processing system 130 may communicate a response (e.g., the response 106) to the client system 102. The response 106 may include the adjustment to the electronic image or an adjusted electronic image. An application may be able to present an adjusted electronic image for an application based on the information included in the response 106. For example, the response(s) 106 may include an adjusted image 112, an adjusted image 122, and an adjusted image 192, which can be presented by the enterprise application 110, the enterprise application 120, and the consumer application 190, respectively.

In some embodiments, the computing system 100 may include one or more data stores. The data store(s) may include an image store 170, and an application format data store 188. The server computing system 130 may access one or more of the data stores 170, 188 to process an electronic image. The data stores 170, 188 may be implemented using any type of persistent storage device, such as a memory storage device or other computer-readable storage medium. In some embodiments, one or more of data stores 170, 188 can be implemented using a database (e.g., a document database, a relational database, or other type of database), a file store, or a combination thereof.

The image processing system 130 may include an image adjusting system 140 and an application manager 150. The image adjusting system 140 and the application manager 150 may be configured to determine an adjustment, if necessary, for adjusting presentation of an electronic image in an application according to a format corresponding to the application.

The application manager 150 can manage execution for applications (e.g., the enterprise application 110, the enterprise application 120, and the consumer application 190) and their associated functions. The application manager 150 may determine information to enable the image adjusting system 140 to determine an adjustment for an electronic image. In some embodiments, if not already provided by the request 104, the client system 102 can determine information about the application that may be beneficial for determining whether to adjust an electronic image and if so, criteria for determining an adjustment. For example, the information can indicate a type of an application, a function of an application for presenting the electronic image, a format for presenting an electronic image, and/or an electronic image for adjustment. The information determined by the application manager 150 can be provided to the image adjusting system 140.

The application manager 150 may access information from one or more of the data stores 170, 188 for processing an electronic image for presentation in an application. In some embodiments, the application manager 150 may access the image data store 170 to retrieve one or more electronic images 172. An electronic image 172 may be retrieved for processing to determine an adjustment for presenting the electronic image 172 in different applications. For example, the application manager 150 may retrieve an electronic image 172 of a person to present in different enterprise applications providing information about the person, such as in a profile. The electronic images 172 may include electronic images that have not been adjusted into a format for presentation into an application. Such images may be considered original electronic images, as they have not been adjusted to a presentation format of an application. The electronic image(s) 172 may have been received from a client system (e.g., the client system 102). In some embodiments, one or more of the electronic images 172 may have been received from a third party source or from another computing device. The electronic images 172 can be in any format.

In some embodiments, the application manager 150 may retrieve, from the application format data store 188, information that includes one or more formats (e.g., a template) for presenting an electronic image (e.g., the electronic image 172) in one or more applications (e.g., the enterprise application 110, the enterprise application 120, or consumer application 190). A format may include information, such as attributes, for presenting an electronic image in the application according to the format. The attributes may include an aspect ratio, a frame size, scaling information, cropping information, a resolution, or the like. In some embodiments, information stored in the application format data store 188 may include one or more default formats for presenting an electronic image in an application. A default format may include information such as default attributes for presenting an electronic image in an application.

The application format data store 188 may store information including criteria for choosing a format. The criteria may be useful for determining a format for to use for image processing of an electronic image for presentation in an application. The criteria may include a type of an application, a function of an application, content in an electronic image, and/or other criteria associated with an application. For example, the application manager 150 can choose a particular format based on the criteria that are satisfied. The format may be stored in associated with an application based on the criteria. A format may be used to present electronic images in multiple applications that are associated with similar or identical criteria.

The image adjusting system 140 may perform processing on an electronic image chosen for presentation in an application. The electronic image may be chosen by the application manager 150. The image adjusting system 140 may receive criteria and/or a format for presenting the electronic image in the application. The processing on the electronic image may include determining an adjustment for presenting the electronic image according to a format selected for the application. Upon determining an adjustment, the image adjusting system 140 may generate an adjusted electronic image (e.g., the adjusted image 112, the adjusted image 122, or the adjusted image 192). In some embodiments, the image adjusting system 140 may store an adjusted electronic image in the image data store 170. The image data store 170 may store adjusted electronic images 174 produced by the image processing system 130. In some embodiments, the adjusted electronic image may be communicated in the response 106 to the client system 102.

Figure 2:
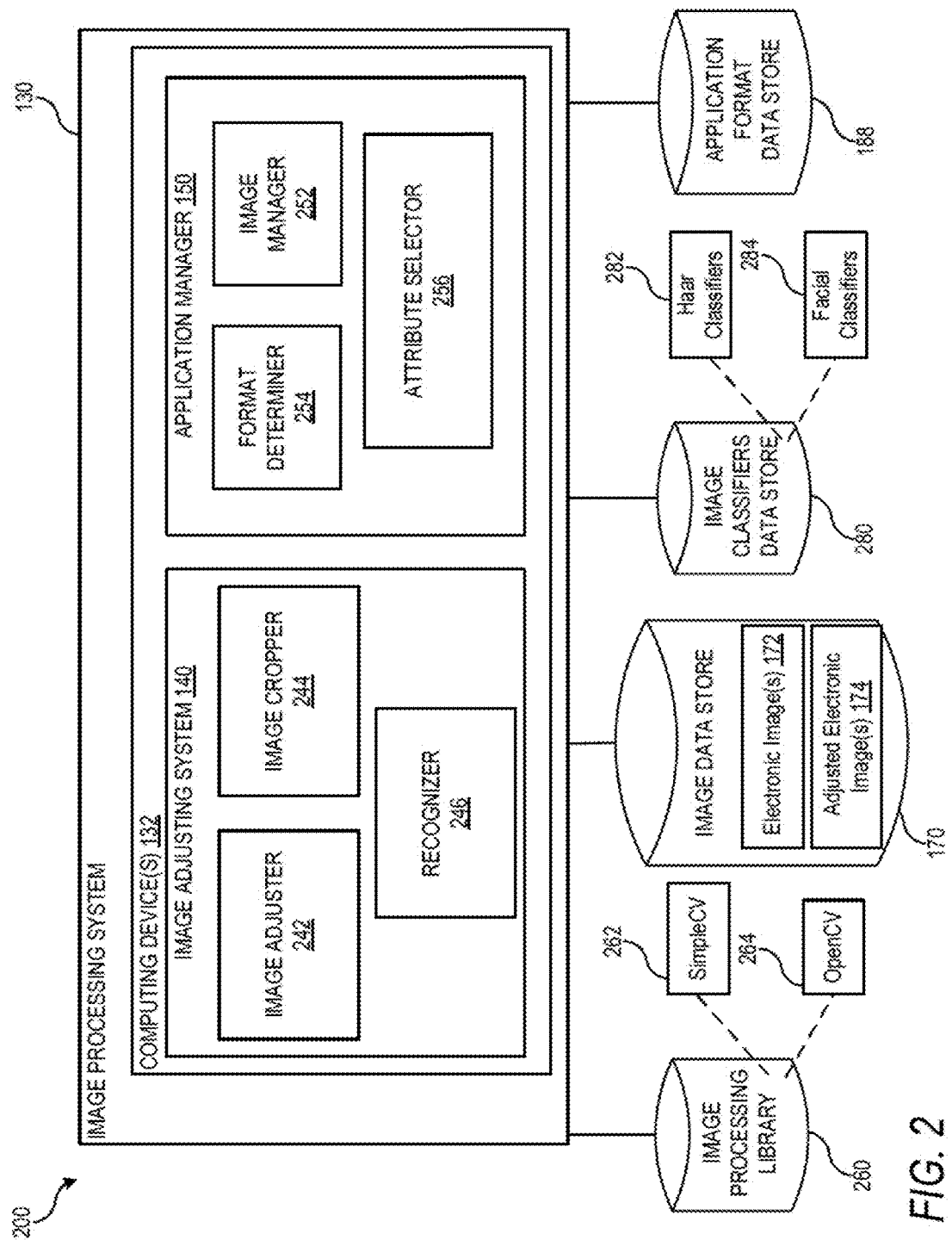
FIG. 2 shows a block diagram of a computing system that can perform intelligent image processing for enterprise applications according to some embodiments of the present invention.

FIG. 2 shows a block diagram of a computing system 200 that can perform intelligent image processing for enterprise applications according to some embodiments of the present invention. Specifically, the computing system 200 further describes how intelligent image process may be performed by an image processing system, e.g., the image processing system 130. The image processing system 130 may access one or more web services that are public, private, and/or public to implement operations described as being performed by the image processing system 130.

The computing system 200 may include one or more libraries, such as an image processing library 260 for data, executable code, instructions, and/or other executable data to process electronic images. For example, the image processing library 260 may include executable code, such as computer vision routines, methods, and/or executable code (e.g., OpenCV 262 and SimpleCV 264). In some embodiments, the image processing library 260 may be implemented as a data store. Operations described as being performed by the computing system 200 may be implemented using the routines, methods, and/or executable code stored in the image processing library 260.

The computing system 200 may include one or more data stores, such as image classifiers 280. The image classifiers 280 may include one or more image classifiers, such as classifiers for faces (e.g., facial classifiers 284), human body parts (e.g., an eye, a nose, an ear, or the like), products, places, buildings, Haar classifiers 282, classifiers for any tangible object, or a combination thereof. A classifier may include a trained decision classifier. In some embodiments, image classifiers 280 may include object classifiers. Haar classifiers 282 may include facial classifiers. One or more of the classifiers in the image classifiers data store 188 may include open-source classifiers. In some embodiments, one or more of the data stores 260, 280 can be implemented using a data base (e.g., a document database, a relational database, or other type of database), a file store, or a combination thereof. The libraries 260 and the data stores 280 may be accessible by the image processing system 130.

The application manager 150 of the image processing system 130 may include an image manager 252, a format determiner 254, and an attribute selector 256. The application manager 150 may be responsible for providing the image adjusting system 140 with an original electronic image to be adjusted and a format by which the electronic image is to be adjusted. In some embodiments, the application manager 150 may determine attributes that may be used to present an electronic image. Based on the enterprise application making a request (e.g., the request 104) to present an electronic image, the application manager 150 can determine a type of the enterprise application and its corresponding format.

The image manager 252 may manage and/or identify the electronic images to be displayed for an enterprise application. In some embodiments, an electronic image may be included or identified in the request 104 from the client system 102. The information in the request 104 may be used to identify and retrieve one or more original electronic images 172 from the image data store 170. In some embodiments, the image manager 252 may determine one or more electronic images to be displayed in an enterprise application based on information indicated by a request (e.g., the request 104) for an enterprise application. The request 104 may indicate or may include information that can be used to identify a feature of an enterprise application, a function of an enterprise application, and/or a type of enterprise application that is being requested. The image manager 252 can determine the electronic images to be displayed based on the features, functions, and/or enterprise application being requested. For example, a request for a "directory" enterprise application may be used by the image manager 252 to determine that electronic images of employees are to be displayed by the enterprise application. Based on the electronic images to be presented, the image manager 252 can retrieve the original electronic images 172 from the image data store 170.

In some embodiments, the image manager 252 may retrieve one or more adjusted electronic images 174 from the image data store 170. An adjusted electronic image 174 may be stored in the image data store 170 for reuse later for the same application or another application that has a similar or identical format for presenting electronic images. An adjusted electronic image 174 may be stored in the image data store 170 upon its generation. The image manager 252 may determine an adjusted electronic image 174 to retrieve based on the electronic images to be displayed in an enterprise application. In some embodiments, the image manager 252 may store information used to index or locate the electronic images stored on the image data store 170. The electronic images may be stored in the image data store 170 according to any criteria, including a type of an application, a feature of an application, a function of an application, other information related to an application, or a combination thereof.

The format determiner 254 may determine a format for presenting the electronic images for display in an application. The electronic images chosen by the image manager 252 may be adjusted, if necessary based on the format. The format may be chosen based on a variety of criteria corresponding to the application. The criteria may include a type of an application, a function of an application, a feature of an application, a subject of the electronic image to be displayed, other criteria that affects how an electronic image is displayed in an application, or a combination thereof. The format determiner 254 may determine the format based on information stored in the application format data store 188. The application format data store 188 may store formats for presenting electronic images in one or more applications. The format determiner 254 may search the application format data store 188 to identify a format based on satisfaction of criteria associated with each format.

In some embodiments, the information in the request 104 can indicate or can be used to determine information about an application in which the electronic image is to be presented. The information about the application can indicate a type of an application or a function of an application presenting an electronic image. For example, the request 104 from the client system 102 may include information such as a type of an application and a function of an application, which can be used to select a format. The information about an application can be used to determine a format for an application. A default format may be chosen for an application upon determining that criteria for formats cannot be satisfied. The default format may be chosen based on one or more factors, such as a type of an application, a function of an application, and/or a subject matter of an electronic image to be displayed.

The attribute selector 256 may determine one or more attributes of an electronic image to be adjusted for presentation in an enterprise application. The attributes of the electronic image can be compared to attributes of the format to determine attributes that have different values or that do not match. For example, the attribute selector may determine an aspect ratio and a frame size of an electronic image and may compare those attributes to an aspect ratio and a frame size of a format to determine whether the attributes match. The attributes to be adjusted may include those attributes that do not match or that have different values. The image adjusting system 140 may adjust an original electronic image according to the attributes selected by the attribute selector 256. In some embodiments, the attribute selector 256 may select attributes to be adjusted corresponding to attributes indicated by the format.

The image adjusting system 140 may generate an adjusted electronic image (e.g., the adjusted electronic image 174). The image adjusting system 140 may include an image adjuster 242, and image cropper 244, and an object recognizer 246. The electronic image (e.g., the original electronic image 172) for adjustment may be chosen by the application manager 150. The electronic image may be adjusted based on a format determined by the application manager 150. In some embodiments, the image adjusting system 140 may adjust an electronic image based on the attributes selected for adjustment.

The image cropper 244 may determine whether to remove content from an electronic image (e.g., an original electronic image 172) presented for an application. The content can correspond to data in the electronic image that, when presented, may be unrelated to a subject matter presented as the electronic image. For example, the image cropper 244 may remove a portion of the background depicted of an electronic image of a person. The image cropper 244 may use various methods, some of which may be described below, as examples for recognizing a person, place, or object in an electronic image. Such techniques may be used to determine a portion of the electronic image corresponding to a subject (e.g., a person, place, or object) presented by the electronic image.

Upon identifying a subject presented by an electronic image, the image cropper 244 may use cropping techniques to extract a portion of the electronic image that contains the subject that is presented when the electronic image is rendered. In some embodiments, the electronic image may be cropped in a manner such that one or more attributes of a cropped portion of the electronic image may remain the same as the attributes of the electronic image before the cropping is performed. In this manner, the cropped electronic image may not be rendered such that a subject presented is not visible (e.g., distorted or impaired). The cropped electronic image may be used for the adjustment. By cropping the electronic image, the electronic image, when presented in an application requesting the electronic image, may enable a subject of the electronic image to appear adequately formatted or to appear distinguishable.

In some embodiments, the image cropper 244 may determine not to remove content from an electronic image. For example, the image cropper 244 may determine not to remove content when the electronic image has little or no content that is unrelated (e.g., background) to a subject presented by the electronic image.

The recognizer 246 may identify a subject of an electronic image. The subject may be used by the image cropper 244 to determine whether to remove content from the electronic image. The recognizer 246 may perform image recognition and/or classification techniques to recognize a subject of an electronic image. The subject may be recognized using one or more image classifiers or object classifiers stored in the image classifiers data store 280. The subject may include a person, place, or object in the electronic image. In some embodiments, the recognizer 246 may identify multiple subjects in an electronic image. The subjects may be identified using one or more image classifiers or object classifiers.

The image adjuster 242 may perform image adjustment of an electronic image (e.g., an original electronic image 172). In some embodiments, the image adjuster 242 may perform image adjustment based on a cropped electronic image generated by the image cropper 244. The image adjuster 242 may perform image adjustment according to the attributes in the format chosen for an enterprise application that has been requested. The image adjuster 242 may determine attributes of an electronic image chosen for adjustment and may compare those attributes to the attributes of the format. The comparison may indicate those attributes that do not match. In some embodiments, the image adjusted 242 may perform image adjustment for the attributes selected for adjustment by the application manager.

Depending on the attributes to be adjusted, the image adjuster 242 may perform an adjustment according to the attributes. In some instances, an electronic image may be adjusted for aspect ratio and/or frame size when these attributes of an electronic image are not sufficient for presentation in an enterprise application without distortion or impairment. In some embodiments, the frame size of an electronic image may be adjusted while maintaining an aspect ratio of the electronic image. The aspect ratio may be maintained by padding the electronic image as the frame size is adjusted. In some embodiments, when a frame size is adjusted to a smaller frame size, the electronic image may be scaled such that the aspect ratio may be maintained. The electronic image may be adjusted to rotate an angle of a subject presented by the image. The angle for rotation may be indicated by the attributes of the format, or may be determined based on the attributes of the format. The image processing resources including the image processing library 260 and/or the image classifiers data store 280 may be used to perform image processing to adjust an image according to a format for an enterprise application. In some embodiments, the image adjuster 242 may determine an adjustment for adjusting presentation of an electronic image (e.g., a cropped electronic image or an original electronic image) in an enterprise application. The adjustment may be used to generate an adjusted electronic image. The adjusted electronic image may be communicated in response(s) 106 to a client system for presentation.

FIGS. 3-9 show various examples of intelligent image processing for enterprise applications according to some embodiments of the present invention. Specifically, the examples illustrated in the FIGS. 3-9 show an electronic image (e.g., an original electronic image) that can be processed to produce an adjusted electronic image for presentation in an enterprise application. The image processing shown in the examples of FIGS. 3-9 may be performed by the image processing system 130, the client system 102, or any other computing system that may perform the techniques disclosed herein. The electronic images (e.g., the original electronic images 172) that are processed in FIGS. 3-9 may be received in a request (e.g., the request 104) from a client system (e.g., the client system 102) or may be obtained from an image data store (e.g., the image data store 170).

Figure 3:
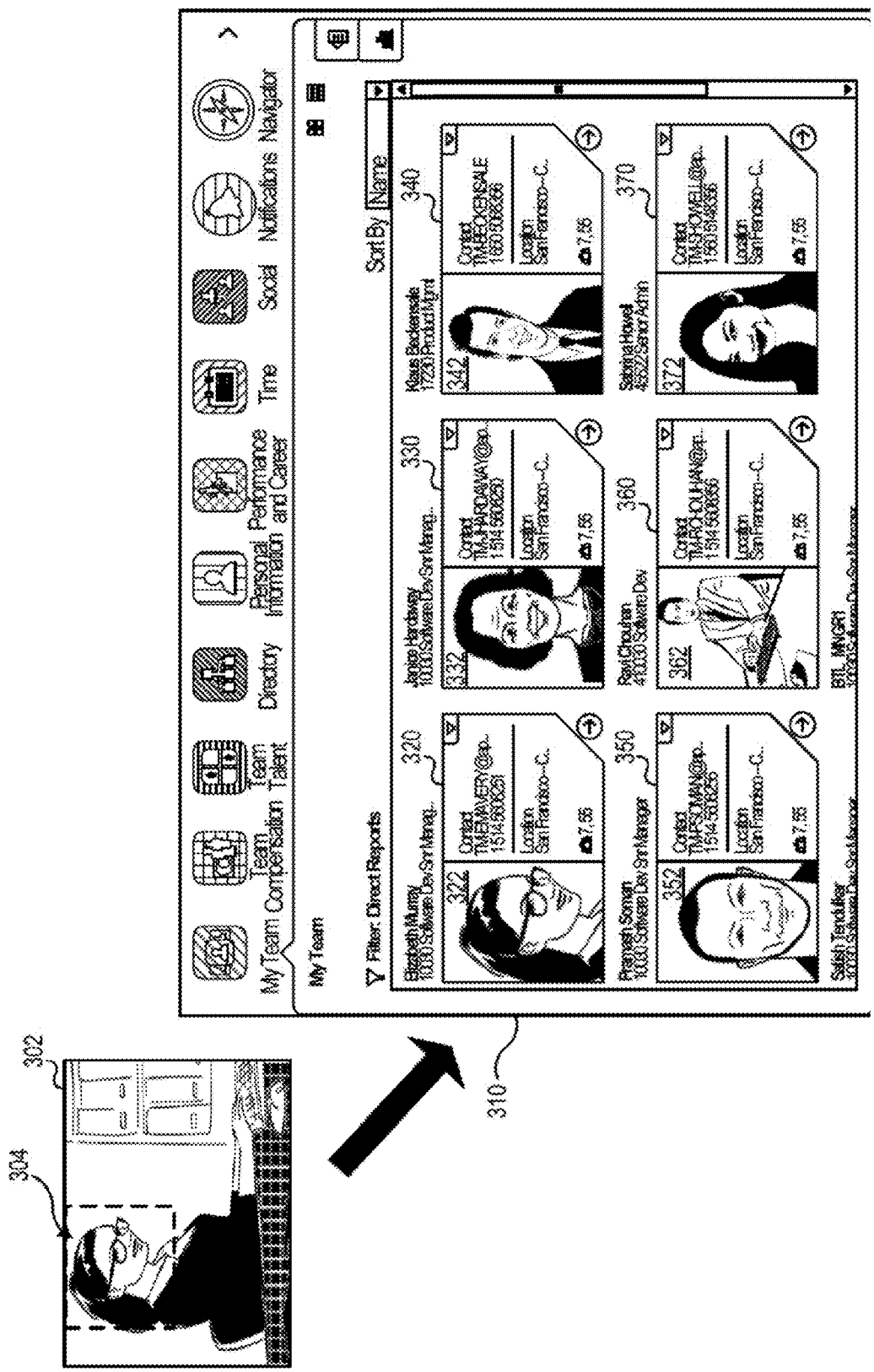
FIGS. 3-9 show various examples of intelligent image processing for enterprise applications according to some embodiments of the present invention.

Now turning to FIG. 3, one example of intelligent image processing is shown according to some embodiments of the present invention. In this example, a graphical user interface (GUI) 310 of an enterprise application ("My Team") is shown. The GUI 310 displays profiles of employees in a team. Each profile may include information about an employee and may be associated with a view, such as a view 320, a view 330, a view 340, a view 350, a view 360, and a view 370. Each of the views 320, 330, 340, 350, 360, 370 may present an electronic image of a person corresponding to a profile. For example, the view 320, the view 330, the view 340, the view 350, the view 360, and the view 370 may present an electronic image 322, an electronic image 332, an electronic image 342, an electronic image 352, an electronic image 362, and an electronic image 372, respectively.

One or more of the electronic images 322, 332, 342, 352, 362, 372 may be an adjusted electronic image that is generated from an original electronic image using intelligent image processing performed by the image processing system 130. In some embodiments, some of the electronic images of people displayed in a view of the GUI 310 may represent an original electronic image that can be presented in a view for a profile without adjustment of the electronic image. For example, the electronic image 322 of a person corresponding to a profile in view 320 may have been adjusted from an original electronic image 302.

In FIG. 3, the original electronic image of a person 302 may be chosen for presentation in a view corresponding to a profile of that person in the GUI 310. The adjusted electronic image 322 may be based on adjustments of the electronic image 322. The adjusted electronic image 322 may be generated for presentation in the GUI 310 according to a format for presenting electronic images of people in the application. The application may be associated with one or more formats for displaying electronic images in the application. The formats may be stored in the application format data store 188. A format may indicate attributes for presenting an electronic image of a person in a profile presented in the GUI 310 such that the person may appear visible or without distortion. For example, a format for displaying an electronic image of a person in a profile may include an aspect ratio and a frame size for a view, e.g., the view 320. The image processing system 130 may determine an adjustment for adjusting the original electronic image 302 according to attributes indicated by the format. The adjustment may be used to generate the adjusted electronic image 322.

In some embodiments, the original electronic image 302 may be adjusted based on content presented in the electronic image 302. For instance, if the electronic image 302 includes other content (e.g., background) that is not related to a subject matter of the original electronic image 302, the original electronic image 302 may be cropped to extract a subject of the original electronic image 302 and to exclude content, e.g., a background, which is not related or unimportant. A cropped electronic image 304 may be produced by cropping the original electronic image 302. By cropping the original electronic image 302, extraneous content may be removed to enable a subject of the original electronic image 302 (e.g., a person) to be displayed sufficiently for the application. In this example, cropping the original electronic image 302 may enable the person in the original electronic image 302 to be presented in a manner that enables the person to be distinguished. Presentation of the person with the background content may not be desirable within an application, such as in a profile presented in the view 320. In this example shown in FIG. 3, the original electronic image 302 may be cropped to generate a cropped electronic mage 304 that does not include the unrelated content such as a background (e.g., cabinets, desk, and a keyboard).

In some embodiments, the original electronic image 302 may be processed using one or more classifiers (e.g., a facial classifier) to detect one or more features (e.g., a face) of a person. The electronic image 302 may be adjusted to remove the portions that are not recognized by any of the classifiers used during processing. In this example, the person in the electronic image 302 may be identified using one or more classifiers, such as facial classifiers.

In some embodiments, an adjusted electronic image (e.g., the adjusted electronic image 322) may be generated based on adjustment of the cropped electronic image 304. In some embodiments, the adjusted electronic image 322 may be generated based on the original electronic image 302 when cropping is not performed for an original electronic image. The cropped electronic image 304 may be processed to determine an adjustment for presenting the cropped electronic image 304 in the view 320. In some embodiments, the adjustment to crop the original electronic image 302 may include retaining the original aspect ratio of the original electronic image 302. Maintaining the original aspect ratio may prevent the portion of the original electronic image 302 retained in the cropped electronic image 304 from being adjusted to an inadequate format in which a subject presented by the portion appears indistguishable. The adjusted electronic image 322 shown in FIG. 3 presents a profile view of the person in the original electronic image 302 with a portion of the background removed.

In some embodiments, the adjusted electronic image 322 may be generated according to a format corresponding to the application. In the example shown, the application may be associated with a format for presenting electronic images within a profile of a view (e.g., the view 322) displayed by the application. The format may indicate attributes for presenting an electronic image of a person. For instance, the attributes can indicate a frame size and an aspect ratio for presenting an electronic image of a person within a profile of a view to enable the person to be distinguishable for the profile.

In the example shown in FIG. 3, an adjustment may be determined based on the format for displaying a profile for the application shown in FIG. 3. The adjustment may be determined using the cropped electronic image 304. The format may indicate information including attributes for presenting an electronic image in the application. In one scenario, the original electronic image 302 may have a frame size which is greater than a frame size indicated by the format. The cropped electronic image 304 may have a frame size greater than the format. Adjustment may be made by scaling down the cropped electronic image 304 to a frame size that satisfies the format. Alternatively or additionally, the cropped electronic image 304 may be further cropped to match a frame size of the format while maintaining a portion of the original electronic image 302 that includes a face of a person to be presented in the view 322. In another scenario where the frame size of the original electronic image 302 is less than the frame size indicated by the format, the original electronic image 302 may be padded to generate the adjusted electronic image 322. Padding of the cropped electronic image 304 may enable the adjusted electronic image 322 to maintain an aspect ratio of the original electronic image 302 while having a frame size that satisfies the format.

In some embodiments, an adjustment of an aspect ratio of the original electronic image 302 may be determined according to a format of the application. In some embodiments, a further adjustment may be determined using the cropped electronic image 304. The adjustment may be determined according to an aspect ratio indicated by the format of the application. In the instance where the cropped electronic image 304 has a frame size greater than the format, the cropped electronic image 304 may be scaled down to have the frame size and the aspect ratio satisfying the format.

Thus, by dynamically adjusting an electronic image according for a format desired for an application, an electronic image may be displayed in a manner that enables the subject of the electronic image to be adequately formatted such that the subject appears distinguishable and/or presented without distortion. In the example shown in FIG. 3, an electronic image of a person may dynamically be processed for presentation within a profile of the person without a user having to provide an original electronic image that satisfies the format for the profile. A burden is removed from a user to determine image formats associated with different enterprise applications. An organization's burden may be reduced from verifying compliance with formats of different applications. In an instance where an organization has many different enterprise applications that present many images of employees according to different requirements, an organization can be assured that a single electronic image of an employee can be adjusted for presentation each different enterprise applications in a manner that enables the employee to be identified in each application.

Figure 4:
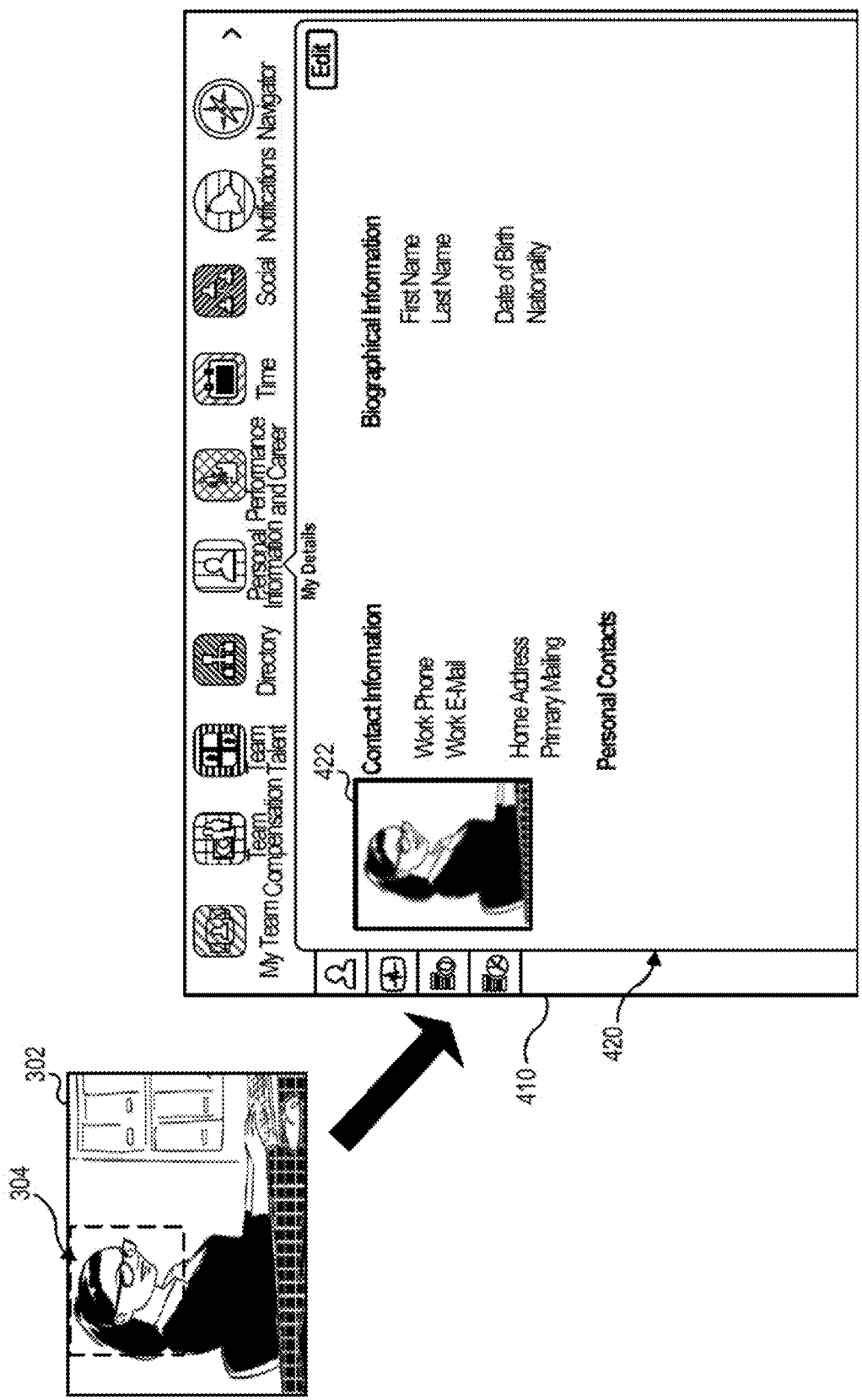

Now turning to FIG. 4, another example of intelligent image processing is described according to some embodiments of the present invention. This example shows an electronic image (e.g., the original electronic image 302) of a subject (e.g., a person) adjusted for presentation in an enterprise application ("Personal Information"). The enterprise application may present a graphical user interface (GUI) 410. The GUI 410 for the enterprise application may provide information (e.g., personal information) about an employee in an organization. The enterprise application shown in FIG. 4 may be different from the enterprise application shown in FIG. 3.

The GUI 410 displays a detailed profile 420 of an employee in an organization. The detailed profile 420 may present personal information about an employee and may present an electronic image 422 of a person that is the employee of the organization. The electronic image 422 may be adjusted from the original electronic image 302. As explained above, different adjusted electronic images can be generated from a single original electronic image, such as the original electronic image 302.

The adjusted electronic image 422 may be generated for presentation in the GUI 410 according to a format for presenting an electronic image in a detailed profile provided by the enterprise application. As explained above, an application may be associated with one or more formats for displaying electronic images in the application. The format for the enterprise application shown in FIG. 4 may include attributes for presenting an electronic image of a person in the detailed profile presented 420 in the GUI 410. The image processing system 130 may determine an adjustment for adjusting the original electronic image 302 according to attributes included in the format. The adjustment may be used to generate the adjusted electronic image 422.

The adjusted electronic image 422 may be generated based on the cropped electronic image 304 of the original electronic image 302. As explained above, the original image 302 includes unrelated content (e.g., the background). The adjusted electronic image 422 presented in the GUI 410 is shown with a portion of the background removed. The original electronic image 302 may be cropped to remove the unrelated content. As explained above, the original electronic image 302 can be processed using one or more classifiers (e.g., a facial classifier) to detect one or more subjects in an electronic image. In this example, facial classifiers may be used to detect a portion of an image including a face. Although cropping may be performed on the original electronic image 302, an aspect ratio of the original electronic image 302 may be maintained to prevent distortion of the subject in the original electronic image 302.

The cropped electronic image 304 may be further processed to generate the adjusted electronic image 422 according to a format corresponding to the application shown in FIG. 4. In some embodiments in which the original electronic image 302 is not cropped, the adjusted electronic image 422 may be generated based on processing of the original electronic image 302 according to the format. In this example, the application may be associated with a format for presenting electronic images in an individual profile of a person provided by the application. The format for presenting an electronic image in the GUI 410 is different from the format for presenting an electronic image in the GUI 310. The format for presenting an electronic image in the GUI 410 may have an additional and/or different attributes. For example, the frame size and/or the aspect ratio may be different of the format associated with the enterprise application shown in FIG. 4.

The cropped electronic image 304 may be processed to determine an adjustment for generating the adjusted electronic image 422. In some embodiments, the cropped electronic image 304 may be processed to determine an adjusted frame size according to the format for the application. The cropped electronic 304 image may be resized to the adjusted frame size. The adjustment to the frame size may include adjusting an aspect ratio if the aspect ratio of the original electronic image is different from the format. In some embodiments, the cropped electronic image 304 may be padded when it is resized to a frame size of the format to preserve the aspect ratio of the original electronic image 302. Presenting the aspect ratio may prevent distortion or effects of rendering a subject in the original electronic image 302. In some embodiments, when the adjusted frame size is smaller than the cropped electronic image 304, the cropped electronic image 304 may be scaled to maintain the aspect ratio of the original electronic image 302 as cropped electronic image is adjust to the frame size of the format.

Figure 5:
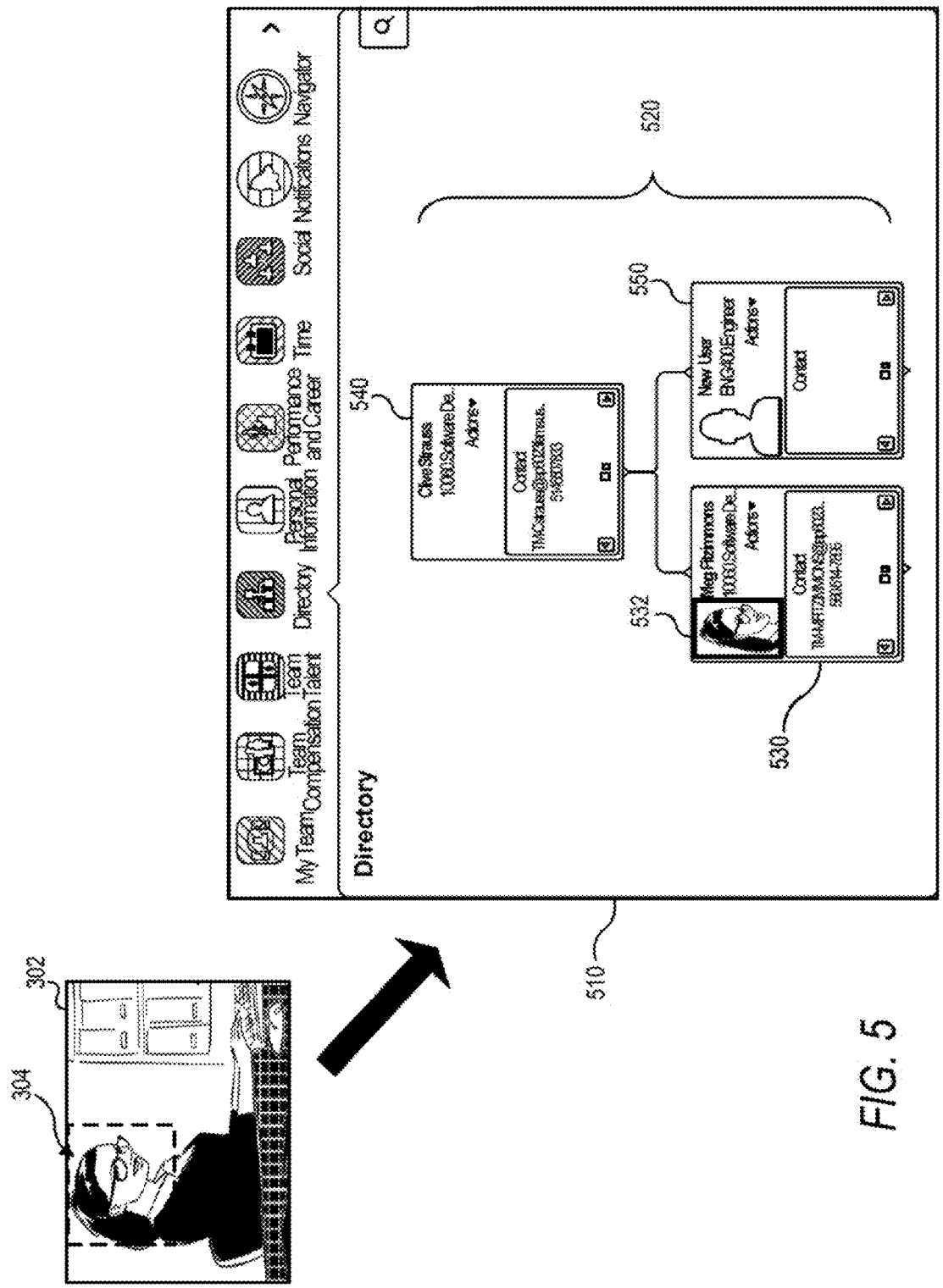

Now turning to FIG. 5, yet another example of intelligent image processing is described according to some embodiments of the present invention. This example shows an electronic image (e.g., the original electronic image 302) of a subject (e.g., a person) adjusted for presentation in an enterprise application. A graphical user interface (GUI) 510 of an enterprise application ("Directory") is shown in FIG. 5. The GUI 510 for the enterprise application provides directory information including an organizational chart of employees in an organization. The enterprise application provides information about each employee shown in the organization's directory. The enterprise application shown in FIG. 5 may be different from other enterprise applications shown in FIGS. 3 and 4.

The GUI 510 displays an organizational directory 520 of employees in an organization. The organization directory may include multiple profiles (e.g., a profile 530, a profile 540, and a profile 550). Each profile may be associated with an employee in the organizational structure. Some of the profiles, such as profile 530 may include an adjusted electronic image 532 of a person. The adjusted electronic image 532 is generated from the original electronic image 302. Using a single original electronic image 302, different adjusted electronic images can be generated for enterprise applications.

The adjusted electronic image 532 may be generated for presentation in the GUI 510 according to a format for presenting an electronic image in a profile of an employee in the employee directory. The format for the enterprise application shown in FIG. 5 may indicate attributes for presenting an electronic image of a person in a profile presented in the GUI 510. The image processing system 130 may determine an adjustment for adjusting the original electronic image 302 according to attributes included in the format. The adjustment may be used to generate the adjusted electronic image 532.

As explained above, the cropped electronic image 304 may be generated by cropping the original electronic image 302 to remove content unrelated to a subject of the original image 302. The adjusted electronic image 532 presented in the GUI 510 is shown with a portion of the background cropped.

The cropped electronic image 304 may be further processed to generate the adjusted electronic image 532 according to a format corresponding to the application shown in FIG. 5. In some embodiments in which the original electronic image 302 is not cropped, the adjusted electronic image 532 may be generated by processing the original electronic image 302 according to the format. In this example, the enterprise application may be associated with a format for presenting an electronic image of an individual for a profile in a directory of employees. The format for presenting an electronic image in the GUI 510 may have an additional and/or different attributes than the format associated with the enterprise applications shown in FIGS. 3 and 4.

The cropped electronic image 304 may be further processed to determine an adjustment for generating the adjusted electronic image 532. The cropped electronic image 304 may be processed to determine an adjusted frame size corresponding to a format for the enterprise application. The profile 530 may have a different frame size than profiles displayed in the other enterprise applications. In this example, the cropped electronic image 304 has a frame size that is larger than the frame size shown in the profile 530. The cropped electronic image 304 may be resized to the adjusted frame size according to the format. The adjustment to the frame size may include adjusting an aspect ratio if the aspect ratio of the original electronic image is different from the format. In some embodiments, the aspect ratio of the cropped image may be adjusted to a different aspect ratio. The adjusted aspect ratio may be chosen as better suited for the adjusted frame size. Adjusting the aspect ratio may improve rending of the subject in the original electronic image 302. The format associated with the application may indicate an aspect ratio to present an electronic image according to a frame size.

Figure 6:
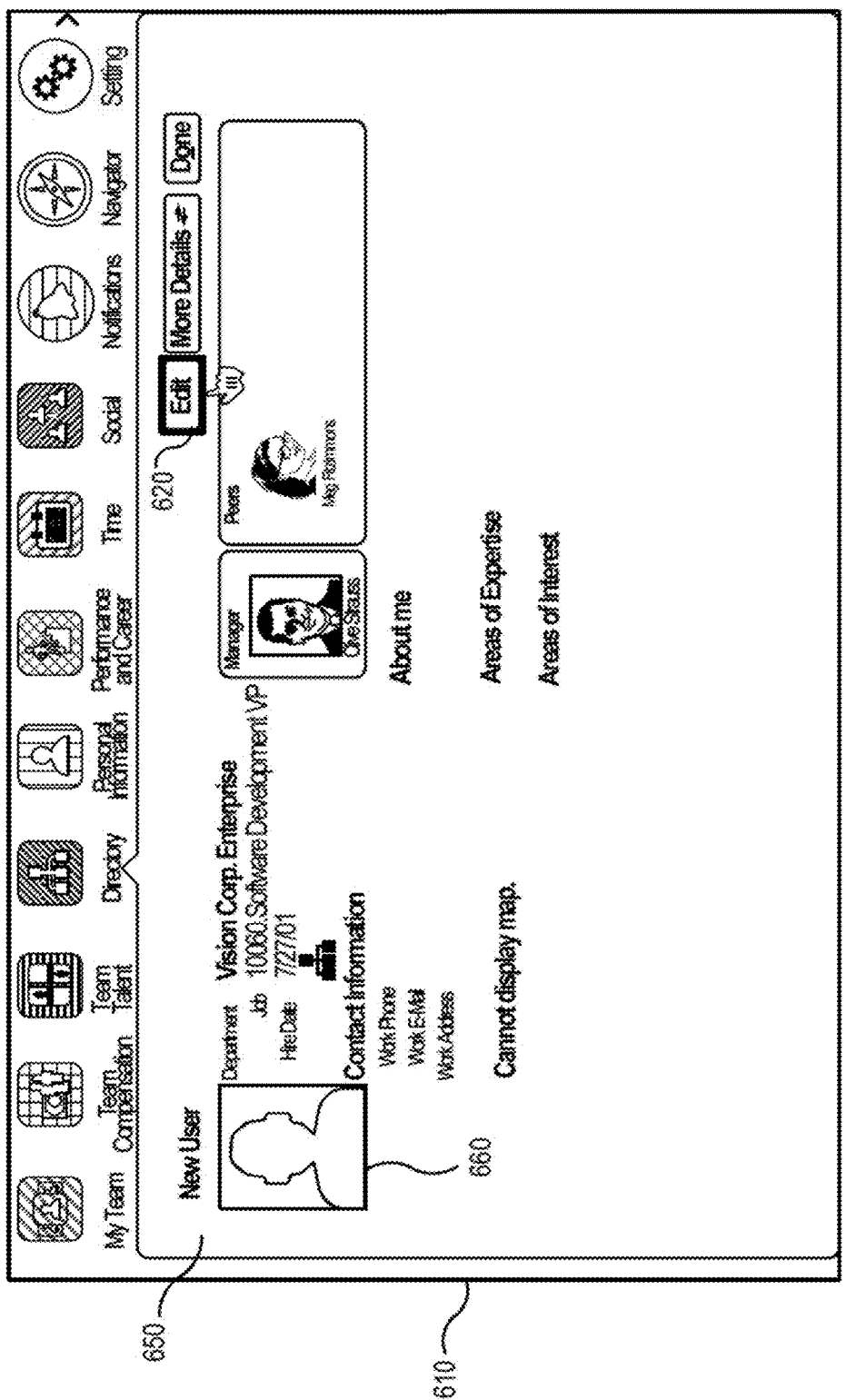

Now turning to FIG. 6, yet another example of intelligent image processing is described according to some embodiments of the present invention. In this example, a GUI 610 is shown which may enable a user to choose an original electronic image to be used for presentation in different enterprise applications. The GUI 610 shows a detailed view of information associated with a profile presented in a directory of employees, such as the directory of employees shown in the GUI 510. Specifically, the GUI 610 shows a detailed profile 650 corresponding to the profile 550. The profile 650 presents a default electronic image 660 that may be shown when an original electronic image is not found for a person associated with the profile 550. In this instance, an adjusted electronic image is not generated because an original electronic image is not found.

The GUI 610 may include an interactive element 620 (e.g., a control) that receives input. The input may indicate a request to enable generation of another GUI to specify a source of an original electronic image. In response to interaction with the interactive element 620, another GUI 710 in FIG. 7 may be generated.

Figure 7:
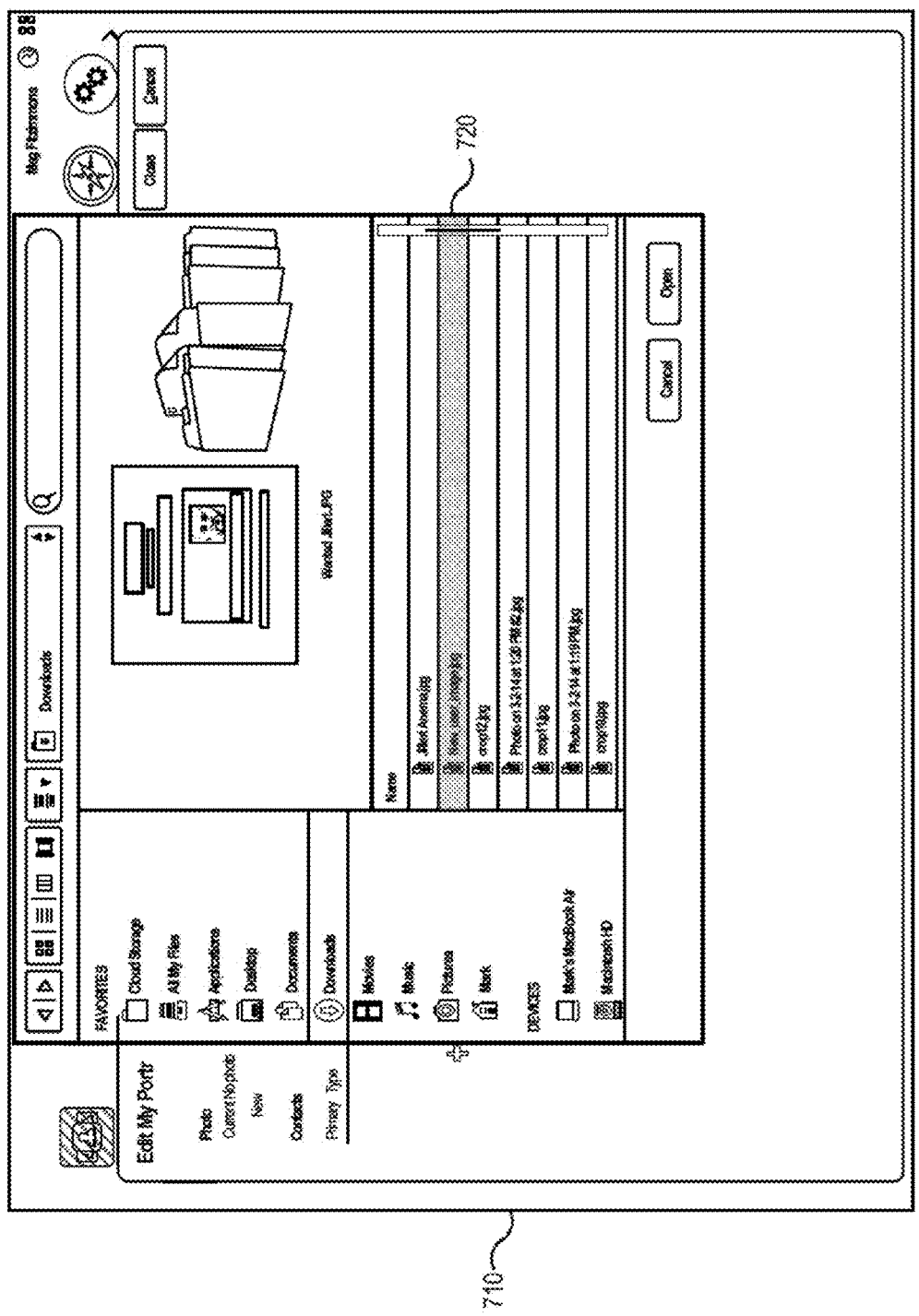

Now turning to FIG. 7, the GUI 710 may enable a user to choose an original electronic image. The GUI 710 may include a selector 720 to choose an original electronic image file from a plurality of files. In some embodiments, the GUI 710 may enable a user to select one or more other locations for locating an original electronic image. Interaction with an interactive element 720 may enable the selected original electronic image to be processed by image processing techniques disclosed herein. For example, the image processing system 130 may process the original electronic image to present an adjusted electronic image in the profile 550.

Figure 8:
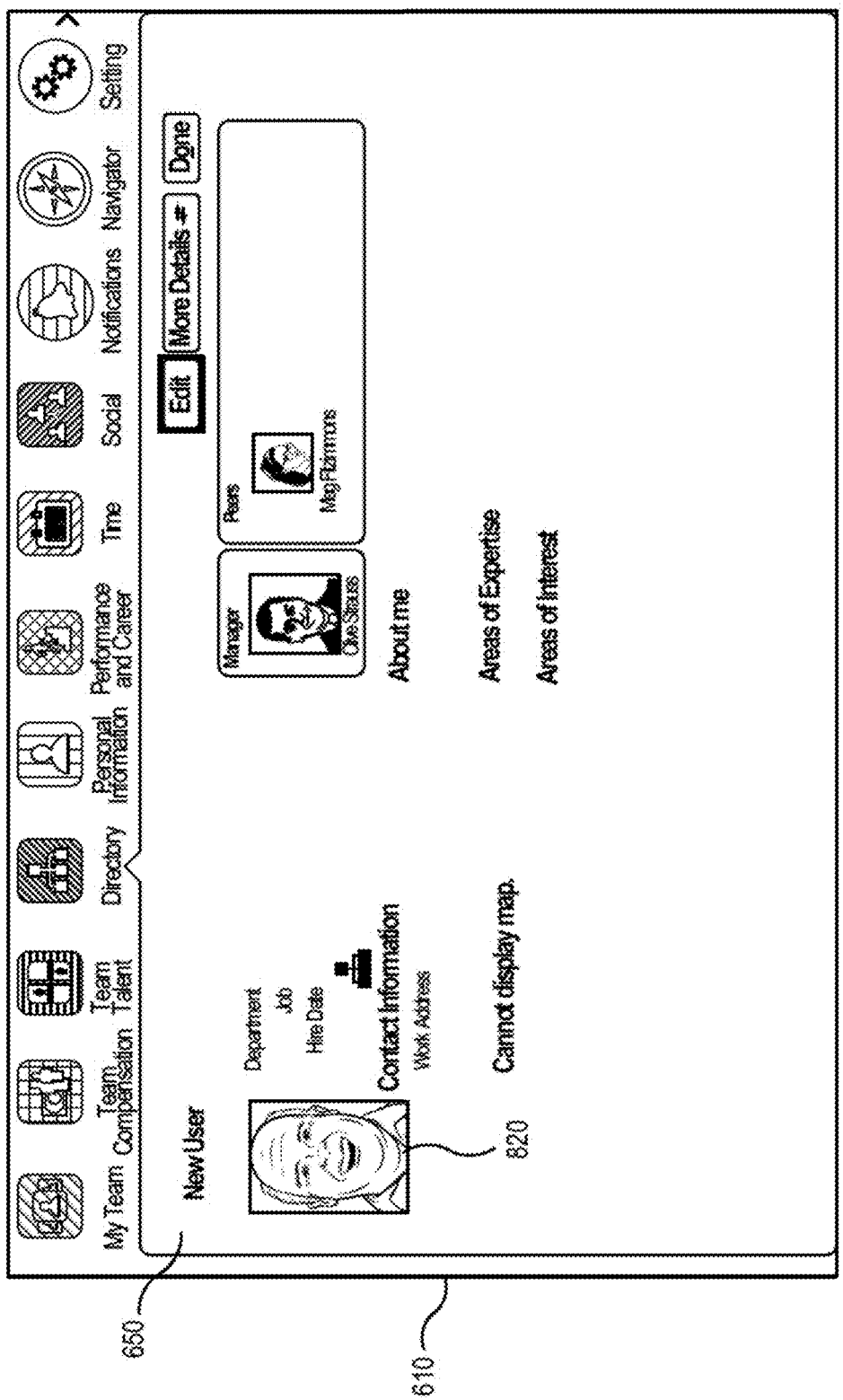

Now turning to FIG. 8, which shows an example of intelligent image processing described according to some embodiments of the present invention. Specifically, FIG. 8 shows the GUI 610 presenting an adjusted electronic image 820 generated based on an adjustment from the original electronic image selected in FIG. 7. The adjusted electronic image 820 may be presented in the detailed profile 650 in the GUI 610. The adjusted electronic image 820 may be adjusted for presentation in the "Directory" enterprise application.

Figure 9:
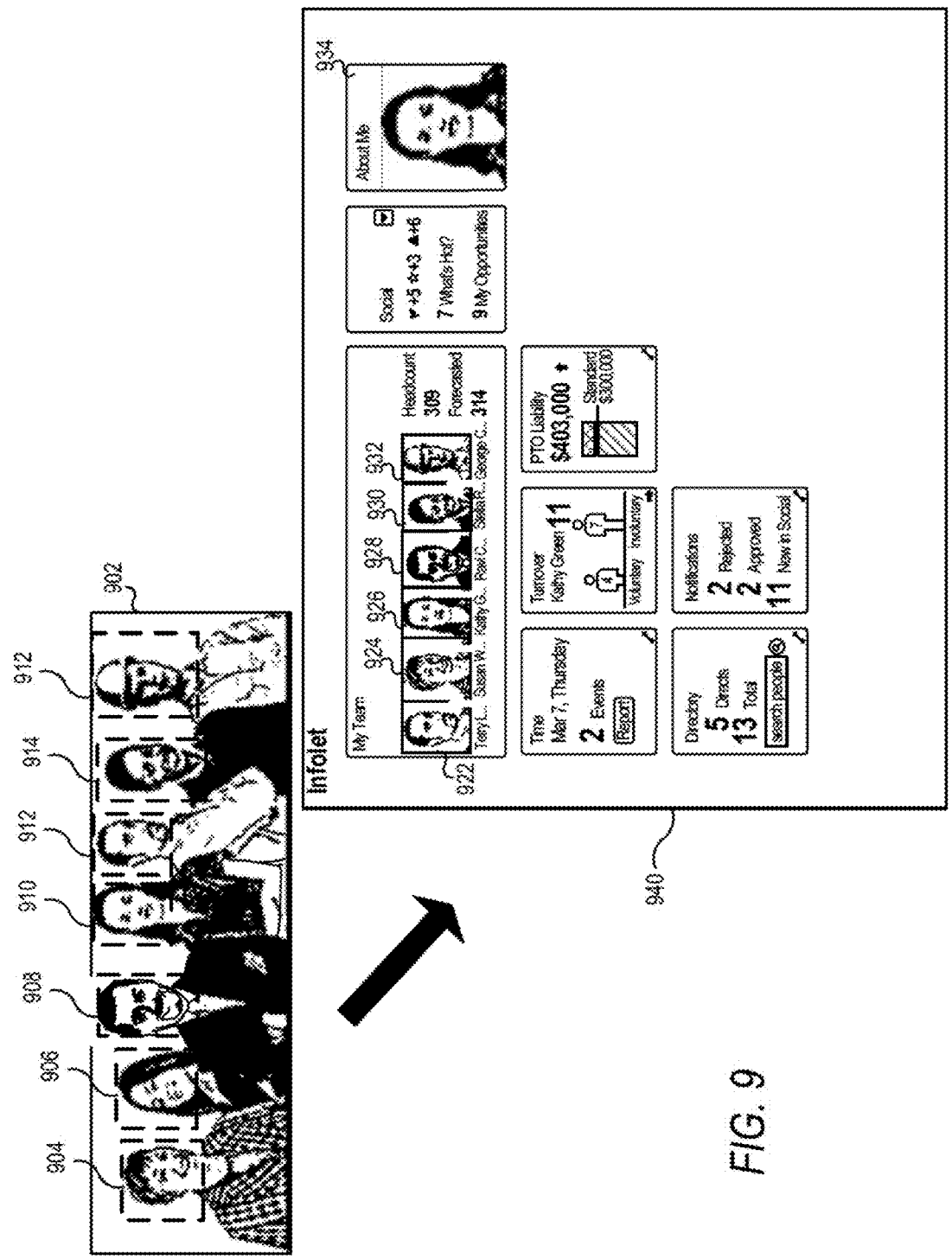

Now turning to FIG. 9, another example of intelligent image processing is described according to some embodiments of the present invention. This example shows an electronic image 902 of a subject (e.g., a group of people) adjusted for presentation in an enterprise application. A GUI 940 of an enterprise application ("Infolet") is shown. In this example, the enterprise application provides information (e.g., statistics and member information) about a team of employees in an organization. The information presented in the GUI 940 may include electronic images of people included in the team. The enterprise application shown in FIG. 9 may be different from the enterprise applications shown in FIGS. 3-8.

An electronic image 902 (e.g., an original electronic image) may be processed to identify multiple images 904-912 associated with different subjects in the electronic image 902. Each of the different subjects may correspond to a person, place, or object. In this example, each of the electronic images 904-912 may correspond to an image of a person. The electronic image 902 may be processed to identify each of the subjects in the image. For example, one or more facial classifiers, image recognition techniques, or image classification techniques may be used to identify faces and/or features of a person in the electronic image. In some embodiments, classifiers may be used to determine an identity of each subject in each of the electronic images 904-912. Each subject may be cropped to produce an electronic image (e.g., a cropped electronic image). In some embodiments, an image may be cropped based on a format for presentation in the enterprise application. For example, each of the electronic images 904-912 may be cropped based on the attributes (e.g., frame size) in the format.

As disclosed herein and illustrated in the previous examples, each cropped electronic image may be processed to determine an adjustment for adjusting the cropped electronic image. Here, each of the electronic images may be adjusted based on a format for presenting the electronic images in the GUI 940. For example, the electronic images 904-912 may be processed to generate adjusted electronic images 922-932, respectively. Each of the adjusted electronic images 922-932 may correspond to a format for presenting electronic images of employees in a team as depicted. In some embodiments, one or more of the cropped electronic images 904-912 may be adjusted to a different format for presenting electronic images in the application. For example, the cropped electronic image 910 may be processed to generate another adjusted electronic image 934 according to a different format as shown in the GUI 940.

The techniques illustrated in FIG. 9 show how image processing may be reduced by processing a single electronic image for many electronic images, each of which can be dynamically processed to determine an adjustment for present the electronic images according to a format of an application.

Figure 10:
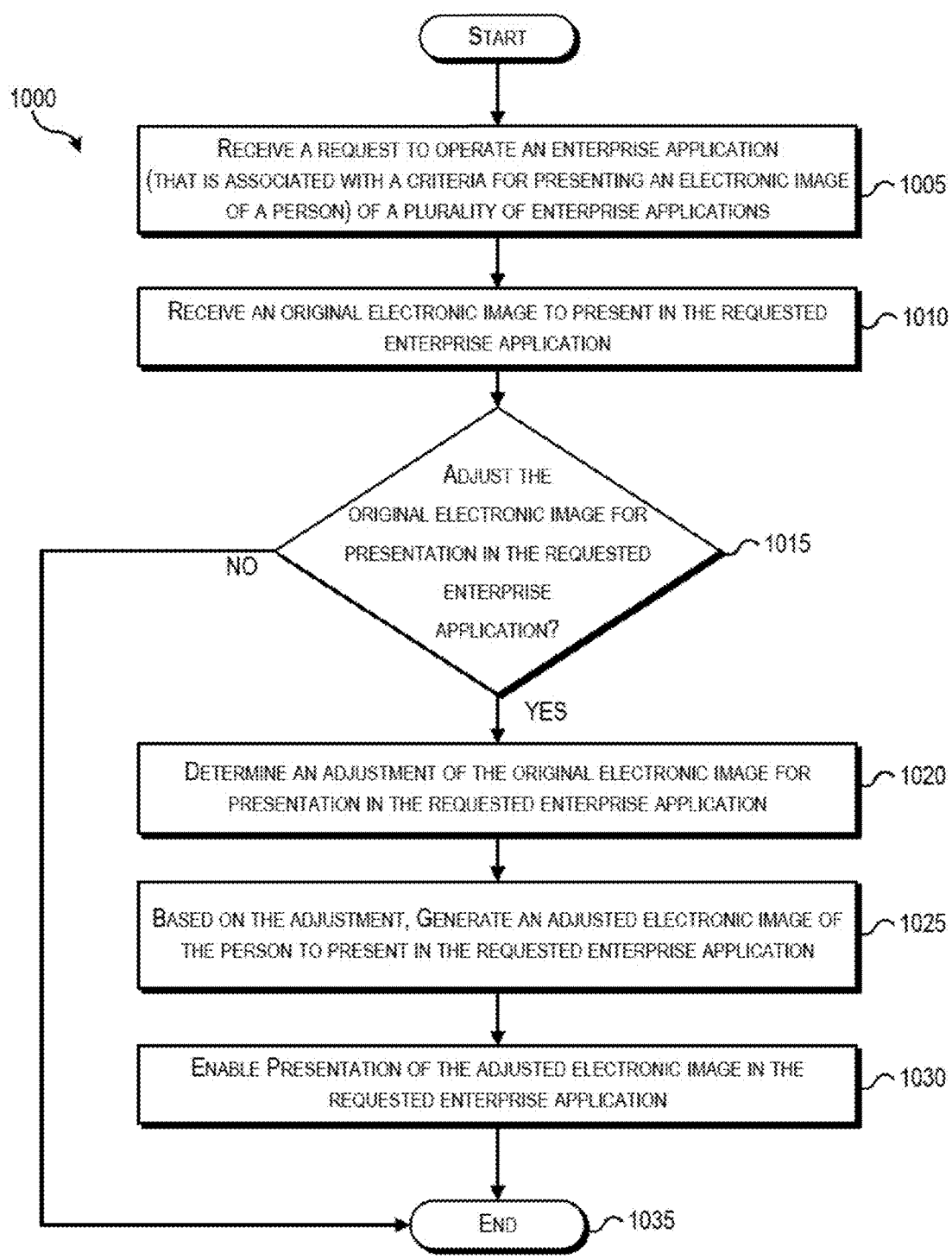
FIG. 10 is a flowchart illustrating a process to perform intelligent image processing for an enterprise application according to some embodiments of the present invention.

FIG. 10 is a flowchart illustrating a process 1000 to perform intelligent image processing for an enterprise application according to some embodiments of the present invention. Specifically, the process 1000 enables a computing system to present an electronic image in an enterprise application according to a format of the enterprise application. The process 1000 may be implemented by the client system 102, the image processing system 130, or a combination thereof.

The process 1000 may begin at block 1005 by receiving a request to operate an enterprise application of a plurality of enterprise applications. For example, the image processing system 130 may receive a request (e.g., the request 104) from the client system 102. The request may be to operate one of the enterprise applications 110, 120, 190. Each of the plurality of enterprise applications may be associated with criteria for presenting an electronic image (e.g., an original electronic image) in the corresponding enterprise application.

At block 1010, the process 1000 may include receiving an original electronic image to present in the request enterprise application. For example, the image processing system 130 may receive an original electronic image in the request 104 from the client system 102. In another example, the image processing system 130 may receive an original electronic image (e.g., an electronic image 172) from the image data store 170.

At block 1015, the process 1000 may include determining whether to adjust the original electronic image for presentation in the requested enterprise application. To make a determination for adjustment of the original electronic image, the process 1000 may obtain a format for presenting an electronic image in the requested enterprise application. For example, the process 1000 may obtain a format from the application format data store 188. The format may be chosen based on a type of the requested enterprise application, a function of the requested enterprise application, and/or the subject in the original electronic image. The format may indicate attributes for presenting an original electronic image. The format may indicate criteria for determining an adjustment based on the attributes. The process 1000 may determine whether attributes (e.g., an aspect ratio or a frame size) of the original electronic image match the attributes indicated by the format. A determination to adjust the original electronic image may be based on whether the attributes of the original electronic image match the attributes in the format or whether the criteria indicated by the format have been satisfied. A determination whether to adjust the original electronic image may be based on whether the original electronic image has content to be cropped, such as a background.

An adjustment may be performed upon determining that the attributes do not match and/or that the criteria indicated by the format has not satisfied. In some embodiments, an adjustment may be performed upon determining that the original electronic image includes content to be removed. Upon determining that the original electronic image does not need an adjustment, the process 1000 may proceed to end at block 1035. Upon determining that the original electronic image needs to be adjusted, the process 1000 may proceed to block 1020.

At block 1020, the process 1000 may determine an adjustment of the original electronic image. The adjustment may be determined based on whether the original electronic image has content to be cropped. For example, the process 1000 may determine whether the original electronic image includes a background to be cropped. The process 1000 may use image classifiers or object classifiers to identify a subject (e.g., a person, place, or an object) in the original electronic image. The adjustment may correspond to cropping a portion of the original electronic image. The adjustment may be determined based on the format for the requested enterprise application. In some embodiments, the adjustment may include modifying an electronic image to have the attributes of the format and/or to satisfy the criteria of the format. The adjustment may be determined based on the cropped portion of the original electronic image.

At block 1025, the process 1000 may include generating an adjusted electronic image to present in the requested enterprise application. The adjusted electronic image is generated using the determined adjustment. In some embodiments, the original electronic image may be cropped, if necessary, and an adjustment based on the format of the requested application may be made using the cropped electronic image. The adjusted electronic image may be generated based on adjustment applied to the cropped electronic image.

At block 1030, the process 1000 may include enabling presentation of the adjusted electronic image in the requested enterprise application during operation of the requested enterprise application. To enable presentation, the process 1000 may send the adjusted electronic image to a client system to present the adjusted electronic image in the requested enterprise application. In some embodiments, enabling presentation of the adjusted electronic image may include generating a GUI for the application that includes the adjusted electronic image. The generated GUI may be presented in the requested enterprise application during operation.

It will be appreciated that process 1000 is illustrative and that variations and modifications are possible. Steps described as sequential may be executed in parallel, order of steps may be varied, and steps may be modified, combined, added or omitted. Process 1000 can be performed each time an enterprise application is requested in which an electronic image is to be displayed according to a format that may differ from other enterprise applications or other functions provided by the requested enterprise application. It should be noted that process 1000 can be performed concurrently for requests to operate other enterprise applications.

Figure 11:
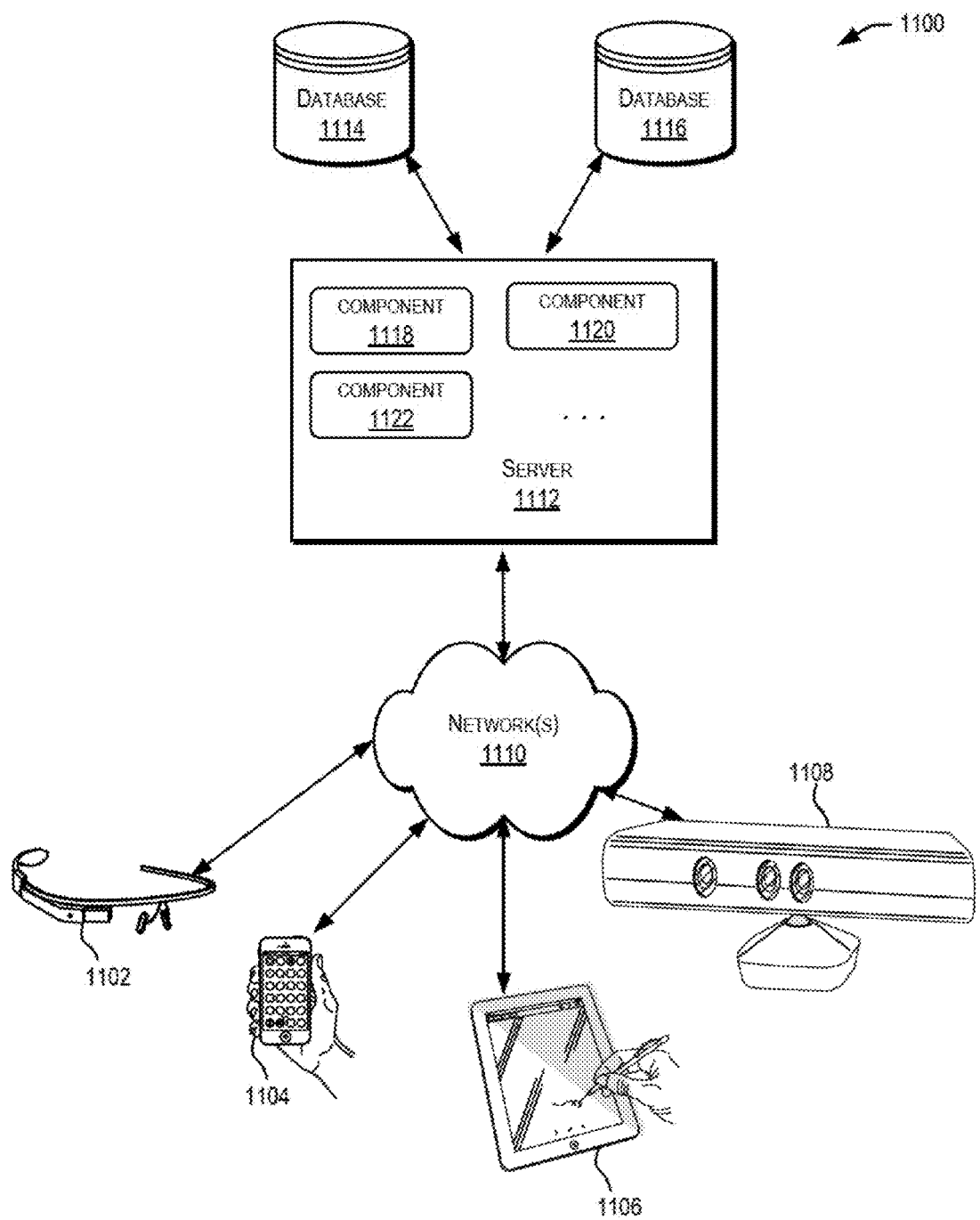
FIG. 11 depicts a simplified diagram of a distributed system for implementing one of the embodiments.

FIG. 11 depicts a simplified diagram of a distributed system 1100 for implementing one of the embodiments. The distributed system 1100 can implement all or a part of the computing system 100 including the client system 102 and/or the image processing system 130 in FIG. 1. The distributed system 1100 can implement operations, methods, and/or processes (e.g., the process 1000 of FIG. 10). In the illustrated embodiment, distributed system 1100 includes one or more client computing devices 1102, 1104, 1106, and 1108, which are configured to execute and operate a client application such as a web browser, proprietary client (e.g., Oracle Forms), or the like over one or more network(s) 1110. In certain embodiments, the one or more client computing devices 1102-1108 can include the client system 102 of FIG. 1. Server 1112 may be communicatively coupled with remote client computing devices 1102, 1104, 1106, and 1108 via network 1110. The server 1112 can include the client system 102 and/or the image processing system 130.

In various embodiments, server 1112 may be adapted to run one or more services or software applications provided by one or more of the components of the system. The services or software applications can include nonvirtual and virtual environments. Virtual environments can include those used for virtual events, tradeshows, simulators, classrooms, shopping exchanges, and enterprises, whether two- or three-dimensional (3D) representations, page-based logical environments, or otherwise. In some embodiments, these services may be offered as web-based or cloud services or under a Software as a Service (SaaS) model to the users of client computing devices 1102, 1104, 1106, and/or 1108. Users operating client computing devices 1102, 1104, 1106, and/or 1108 may in turn utilize one or more client applications to interact with server 1112 to utilize the services provided by these components.

In the configuration depicted in the figure, the software components 1118, 1120 and 1122 of system 1100 are shown as being implemented on server 1112. In other embodiments, one or more of the components of system 1100 and/or the services provided by these components may also be implemented by one or more of the client computing devices 1102, 1104, 1106, and/or 1108. Users operating the client computing devices may then utilize one or more client applications to use the services provided by these components. These components may be implemented in hardware, firmware, software, or combinations thereof. It should be appreciated that various different system configurations are possible, which may be different from distributed system 1100. The embodiment shown in the figure is thus one example of a distributed system for implementing an embodiment system and is not intended to be limiting.

Client computing devices 1102, 1104, 1106, and/or 1108 may be portable handheld devices (e.g., an iPhone®, cellular telephone, an iPad®, computing tablet, a personal digital assistant (PDA)) or wearable devices (e.g., a Google Glass® head mounted display), running software such as Microsoft Windows Mobile®, and/or a variety of mobile operating systems such as iOS, Windows Phone, Android, BlackBerry 10, Palm OS, and the like, and being Internet, e-mail, short message service (SMS), Blackberry®, or other communication protocol enabled. The client computing devices can be general purpose personal computers including, by way of example, personal computers and/or laptop computers running various versions of Microsoft Windows®, Apple Macintosh®, and/or Linux operating systems. The client computing devices can be workstation computers running any of a variety of commercially-available UNIX® or UNIX-like operating systems, including without limitation the variety of GNU/Linux operating systems, such as for example, Google Chrome OS. Alternatively, or in addition, client computing devices 1102, 1104, 1106, and 1108 may be any other electronic device, such as a thin-client computer, an Internet-enabled gaming system (e.g., a Microsoft Xbox gaming console with or without a Kinect® gesture input device), and/or a personal messaging device, capable of communicating over network(s) 1110.

Although exemplary distributed system 1100 is shown with four client computing devices, any number of client computing devices may be supported. Other devices, such as devices with sensors, etc., may interact with server 1112.

Network(s) 1110 in distributed system 1100 may be any type of network familiar to those skilled in the art that can support data communications using any of a variety of commercially-available protocols, including without limitation TCP/IP (transmission control protocol/Internet protocol), SNA (systems network architecture), IPX (Internet packet exchange), AppleTalk, and the like. Merely by way of example, network(s) 1110 can be a local area network (LAN), such as one based on Ethernet, Token-Ring and/or the like. Network(s) 1110 can be a wide-area network and the Internet. It can include a virtual network, including without limitation a virtual private network (VPN), an intranet, an extranet, a public switched telephone network (PSTN), an infra-red network, a wireless network (e.g., a network operating under any of the Institute of Electrical and Electronics (IEEE) 802.11 suite of protocols, Bluetooth®, and/or any other wireless protocol); and/or any combination of these and/or other networks.

Server 1112 may be composed of one or more general purpose computers, specialized server computers (including, by way of example, PC (personal computer) servers, UNIX® servers, mid-range servers, mainframe computers, rack-mounted servers, etc.), server farms, server clusters, or any other appropriate arrangement and/or combination. Server 1112 can include one or more virtual machines running virtual operating systems, or other computing architectures involving virtualization. One or more flexible pools of logical storage devices can be virtualized to maintain virtual storage devices for the server. Virtual networks can be controlled by server 1112 using software defined networking. In various embodiments, server 1112 may be adapted to run one or more services or software applications described in the foregoing disclosure. For example, server 1112 may correspond to a server for performing processing described above according to an embodiment of the present invention.

Server 1112 may run an operating system including any of those discussed above, as well as any commercially available server operating system. Server 1112 may also run any of a variety of additional server applications and/or mid-tier applications, including HTTP servers, FTP servers, CGI (common gateway interface) servers, JAVA® servers, database servers, and the like. Exemplary database servers include without limitation those commercially available from Oracle, Microsoft, Sybase, IBM (International Business Machines), and the like.

In some implementations, server 1112 may include one or more applications to analyze and consolidate data feeds and/or event updates received from users of client computing devices 1102, 1104, 1106, and 1108. As an example, data feeds and/or event updates may include, but are not limited to, Twitter® feeds, Facebook® updates or real-time updates received from one or more third party information sources and continuous data streams, which may include real-time events related to sensor data applications, financial tickers, network performance measuring tools (e.g., network monitoring and traffic management applications), clickstream analysis tools, automobile traffic monitoring, and the like. Server 1112 may also include one or more applications to display the data feeds and/or real-time events via one or more display devices of client computing devices 1102, 1104, 1106, and 1108.

Distributed system 1100 may also include one or more databases 1114 and 1116. Databases 1114 and 1116 may reside in a variety of locations. By way of example, one or more of databases 1114 and 1116 may reside on a non-transitory storage medium local to (and/or resident in) server 1112. Alternatively, databases 1114 and 1116 may be remote from server 1112 and in communication with server 1112 via a network-based or dedicated connection. In one set of embodiments, databases 1114 and 1116 may reside in a storage-area network (SAN). Similarly, any necessary files for performing the functions attributed to server 1112 may be stored locally on server 1112 and/or remotely, as appropriate. In one set of embodiments, databases 1114 and 1116 may include relational databases, such as databases provided by Oracle, that are adapted to store, update, and retrieve data in response to SQL-formatted commands. The one or more databases 1114 and 1116 can include or be implemented as the image data store 170, the image classifier data store 280, the application format data store 188, the image processing library 260, or a combination thereof.

Figure 12:
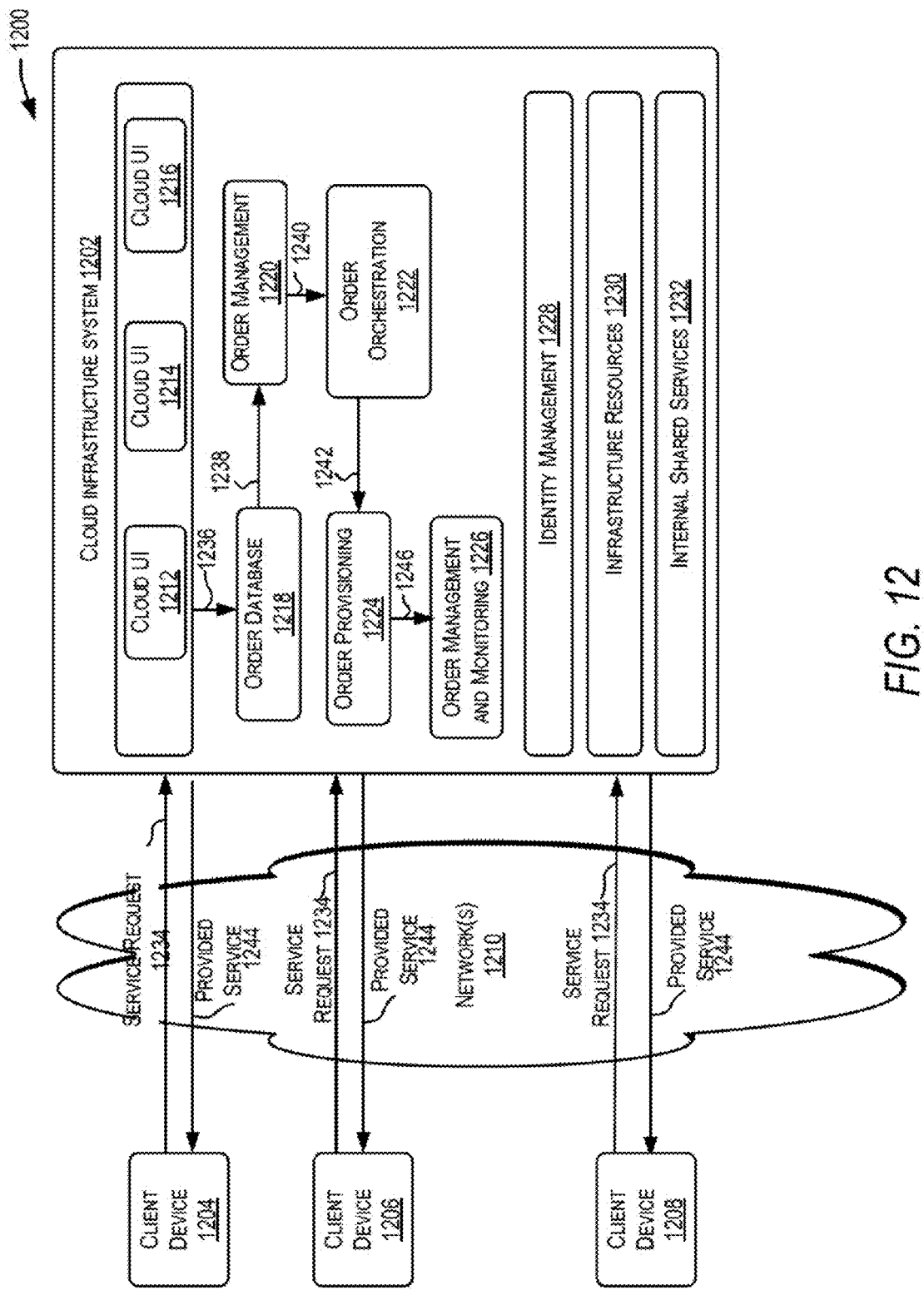
FIG. 12 shows a simplified block diagram of components of a system environment by which services provided by the components of an embodiment system may be offered as cloud services, in accordance with an embodiment of the present disclosure.

FIG. 12 is a simplified block diagram of one or more components of a system environment 1200 by which services provided by one or more components of an embodiment system may be offered as cloud services, in accordance with an embodiment of the present invention. The system environment 1200 can include or implement the computing system 100, the computing system 200, the client system 102, the image processing system 130, or a combination thereof. The system environment 1200 can implement operations, methods, and/or processes (e.g., the process 1000 of FIG. 10). In the illustrated embodiment, system environment 1200 includes one or more client computing devices 1204, 1206, and 1208 that may be used by users to interact with a cloud infrastructure system 1202 that provides cloud services. The client computing devices may be configured to operate a client application such as a web browser, a proprietary client application (e.g., Oracle Forms), or some other application, which may be used by a user of the client computing device to interact with cloud infrastructure system 1202 to use services provided by cloud infrastructure system 1202.

It should be appreciated that cloud infrastructure system 1202 depicted in the figure may have other components than those depicted. Further, the embodiment shown in the figure is only one example of a cloud infrastructure system that may incorporate an embodiment of the invention. For example, the cloud infrastructure system 1202 can include or implement the computing system 100, the computing system 200, the client system 102, the image processing system 130, or a combination thereof. In some other embodiments, cloud infrastructure system 1202 may have more or fewer components than shown in the figure, may combine two or more components, or may have a different configuration or arrangement of components.

Client computing devices 1204, 1206, and 1208 may be devices similar to those described above for 1102, 1104, 1106, and 1108.

Although exemplary system environment 1200 is shown with three client computing devices, any number of client computing devices may be supported. Other devices such as devices with sensors, etc. may interact with cloud infrastructure system 1202.

Network(s) 1210 may facilitate communications and exchange of data between clients 1204, 1206, and 1208 and cloud infrastructure system 1202. Each network may be any type of network familiar to those skilled in the art that can support data communications using any of a variety of commercially-available protocols, including those described above for network(s) 1110.

Cloud infrastructure system 1202 may comprise one or more computers and/or servers that may include those described above for server 1112.

In certain embodiments, services provided by the cloud infrastructure system may include a host of services that are made available to users of the cloud infrastructure system on demand, such as online data storage and backup solutions, Web-based e-mail services, hosted office suites and document collaboration services, database processing, managed technical support services, and the like. Services provided by the cloud infrastructure system can dynamically scale to meet the needs of its users. A specific instantiation of a service provided by cloud infrastructure system is referred to herein as a "service instance." In general, any service made available to a user via a communication network, such as the Internet, from a cloud service provider's system is referred to as a "cloud service." Typically, in a public cloud environment, servers and systems that make up the cloud service provider's system are different from the customer's own on-premises servers and systems. For example, a cloud service provider's system may host an application, and a user may, via a communication network such as the Internet, on demand, order and use the application.

In some examples, a service in a computer network cloud infrastructure may include protected computer network access to storage, a hosted database, a hosted web server, a software application, or other service provided by a cloud vendor to a user, or as otherwise known in the art. For example, a service can include password-protected access to remote storage on the cloud through the Internet. As another example, a service can include a web service-based hosted relational database and a script-language middleware engine for private use by a networked developer. As another example, a service can include access to an email software application hosted on a cloud vendor's web site.

In certain embodiments, cloud infrastructure system 1202 may include a suite of applications, middleware, and database service offerings that are delivered to a customer in a self-service, subscription-based, elastically scalable, reliable, highly available, and secure manner. An example of such a cloud infrastructure system is the Oracle Public Cloud provided by the present assignee.

Large volumes of data, sometimes referred to as big data, can be hosted and/or manipulated by the infrastructure system on many levels and at different scales. Such data can include data sets that are so large and complex that it can be difficult to process using typical database management tools or traditional data processing applications. For example, terabytes of data may be difficult to store, retrieve, and process using personal computers or their rack-based counterparts. Such sizes of data can be difficult to work with using most current relational database management systems and desktop statistics and visualization packages. They can require massively parallel processing software running thousands of server computers, beyond the structure of commonly used software tools, to capture, curate, manage, and process the data within a tolerable elapsed time.

Extremely large data sets can be stored and manipulated by analysts and researchers to visualize large amounts of data, detect trends, and/or otherwise interact with the data. Tens, hundreds, or thousands of processors linked in parallel can act upon such data in order to present it or simulate external forces on the data or what it represents. These data sets can involve structured data, such as that organized in a database or otherwise according to a structured model, and/or unstructured data (e.g., emails, images, data blobs (binary large objects), web pages, complex event processing). By leveraging an ability of an embodiment to relatively quickly focus more (or fewer) computing resources upon an objective, the cloud infrastructure system may be better available to carry out tasks on large data sets based on demand from a business, government agency, research organization, private individual, group of like-minded individuals or organizations, or other entity.

In various embodiments, cloud infrastructure system 1202 may be adapted to automatically provision, manage and track a customer's subscription to services offered by cloud infrastructure system 1202. Cloud infrastructure system 1202 may provide the cloud services via different deployment models. For example, services may be provided under a public cloud model in which cloud infrastructure system 1202 is owned by an organization selling cloud services (e.g., owned by Oracle) and the services are made available to the general public or different industry enterprises. As another example, services may be provided under a private cloud model in which cloud infrastructure system 1202 is operated solely for a single organization and may provide services for one or more entities within the organization. The cloud services may also be provided under a community cloud model in which cloud infrastructure system 1202 and the services provided by cloud infrastructure system 1202 are shared by several organizations in a related community. The cloud services may also be provided under a hybrid cloud model, which is a combination of two or more different models.

In some embodiments, the services provided by cloud infrastructure system 1202 may include one or more services provided under Software as a Service (SaaS) category, Platform as a Service (PaaS) category, Infrastructure as a Service (IaaS) category, or other categories of services including hybrid services. A customer, via a subscription order, may order one or more services provided by cloud infrastructure system 1202. Cloud infrastructure system 1202 then performs processing to provide the services in the customer's subscription order.

In some embodiments, the services provided by cloud infrastructure system 1202 may include, without limitation, application services, platform services and infrastructure services. In some examples, application services may be provided by the cloud infrastructure system via a SaaS platform. The SaaS platform may be configured to provide cloud services that fall under the SaaS category. For example, the SaaS platform may provide capabilities to build and deliver a suite of on-demand applications on an integrated development and deployment platform. The SaaS platform may manage and control the underlying software and infrastructure for providing the SaaS services. By utilizing the services provided by the SaaS platform, customers can utilize applications executing on the cloud infrastructure system. Customers can acquire the application services without the need for customers to purchase separate licenses and support. Various different SaaS services may be provided. Examples include, without limitation, services that provide solutions for sales performance management, enterprise integration, and business flexibility for large organizations.

In some embodiments, platform services may be provided by the cloud infrastructure system via a PaaS platform. The PaaS platform may be configured to provide cloud services that fall under the PaaS category. Examples of platform services may include without limitation services that enable organizations (such as Oracle) to consolidate existing applications on a shared, common architecture, as well as the ability to build new applications that leverage the shared services provided by the platform. The PaaS platform may manage and control the underlying software and infrastructure for providing the PaaS services. Customers can acquire the PaaS services provided by the cloud infrastructure system without the need for customers to purchase separate licenses and support. Examples of platform services include, without limitation, Oracle Java Cloud Service (JCS), Oracle Database Cloud Service (DBCS), and others.

By utilizing the services provided by the PaaS platform, customers can employ programming languages and tools supported by the cloud infrastructure system and also control the deployed services. In some embodiments, platform services provided by the cloud infrastructure system may include database cloud services, middleware cloud services (e.g., Oracle Fusion Middleware services), and Java cloud services. In one embodiment, database cloud services may support shared service deployment models that enable organizations to pool database resources and offer customers a Database as a Service in the form of a database cloud. Middleware cloud services may provide a platform for customers to develop and deploy various business applications, and Java cloud services may provide a platform for customers to deploy Java applications, in the cloud infrastructure system.

Various different infrastructure services may be provided by an IaaS platform in the cloud infrastructure system. The infrastructure services facilitate the management and control of the underlying computing resources, such as storage, networks, and other fundamental computing resources for customers utilizing services provided by the SaaS platform and the PaaS platform.

In certain embodiments, cloud infrastructure system 1202 may also include infrastructure resources 1230 for providing the resources used to provide various services to customers of the cloud infrastructure system. In one embodiment, infrastructure resources 1230 may include pre-integrated and optimized combinations of hardware, such as servers, storage, and networking resources to execute the services provided by the PaaS platform and the SaaS platform.

In some embodiments, resources in cloud infrastructure system 1202 may be shared by multiple users and dynamically re-allocated per demand. Additionally, resources may be allocated to users in different time zones. For example, cloud infrastructure system 1230 may enable a first set of users in a first time zone to utilize resources of the cloud infrastructure system for a specified number of hours and then enable the re-allocation of the same resources to another set of users located in a different time zone, thereby maximizing the utilization of resources.

In certain embodiments, a number of internal shared services 1232 may be provided that are shared by different components or modules of cloud infrastructure system 1202 and by the services provided by cloud infrastructure system 1202. These internal shared services may include, without limitation, a security and identity service, an integration service, an enterprise repository service, an enterprise manager service, a virus scanning and white list service, a high availability, backup and recovery service, service for enabling cloud support, an email service, a notification service, a file transfer service, and the like.

In certain embodiments, cloud infrastructure system 1202 may provide comprehensive management of cloud services (e.g., SaaS, PaaS, and IaaS services) in the cloud infrastructure system. In one embodiment, cloud management functionality may include capabilities for provisioning, managing and tracking a customer's subscription received by cloud infrastructure system 1202, and the like.

In one embodiment, as depicted in the figure, cloud management functionality may be provided by one or more modules, such as an order management module 1220, an order orchestration module 1222, an order provisioning module 1224, an order management and monitoring module 1226, and an identity management module 1228. These modules may include or be provided using one or more computers and/or servers, which may be general purpose computers, specialized server computers, server farms, server clusters, or any other appropriate arrangement and/or combination.

In exemplary operation 1234, a customer using a client device, such as client device 1204, 1206 or 1208, may interact with cloud infrastructure system 1202 by requesting one or more services provided by cloud infrastructure system 1202 and placing an order for a subscription for one or more services offered by cloud infrastructure system 1202. In certain embodiments, the customer may access a cloud User Interface (UI), cloud UI 1212, cloud UI 1214 and/or cloud UI 1216 and place a subscription order via these UIs. The order information received by cloud infrastructure system 1202 in response to the customer placing an order may include information identifying the customer and one or more services offered by the cloud infrastructure system 1202 that the customer intends to subscribe to.

After an order has been placed by the customer, the order information is received via the cloud UIs, 1212, 1214 and/or 1216.

At operation 1236, the order is stored in order database 1218. Order database 1218 can be one of several databases operated by cloud infrastructure system 1218 and operated in conjunction with other system elements.

At operation 1238, the order information is forwarded to an order management module 1220. In some instances, order management module 1220 may be configured to perform billing and accounting functions related to the order, such as verifying the order, and upon verification, booking the order.

At operation 1240, information regarding the order is communicated to an order orchestration module 1222. Order orchestration module 1222 may utilize the order information to orchestrate the provisioning of services and resources for the order placed by the customer. In some instances, order orchestration module 1222 may orchestrate the provisioning of resources to support the subscribed services using the services of order provisioning module 1224.

In certain embodiments, order orchestration module 1222 enables the management of business processes associated with each order and applies business logic to determine whether an order should proceed to provisioning. At operation 1242, upon receiving an order for a new subscription, order orchestration module 1222 sends a request to order provisioning module 1224 to allocate resources and configure those resources needed to fulfill the subscription order. Order provisioning module 1224 enables the allocation of resources for the services ordered by the customer. Order provisioning module 1224 provides a level of abstraction between the cloud services provided by cloud infrastructure system 1200 and the physical implementation layer that is used to provision the resources for providing the requested services. Order orchestration module 1222 may thus be isolated from implementation details, such as whether or not services and resources are actually provisioned on the fly or pre-provisioned and only allocated/assigned upon request.

At operation 1244, once the services and resources are provisioned, a notification of the provided service may be sent to customers on client devices 1204, 1206 and/or 1208 by order provisioning module 1224 of cloud infrastructure system 1202.

At operation 1246, the customer's subscription order may be managed and tracked by an order management and monitoring module 1226. In some instances, order management and monitoring module 1226 may be configured to collect usage statistics for the services in the subscription order, such as the amount of storage used, the amount data transferred, the number of users, and the amount of system up time and system down time.

In certain embodiments, cloud infrastructure system 1200 may include an identity management module 1228. Identity management module 1228 may be configured to provide identity services, such as access management and authorization services in cloud infrastructure system 1200. In some embodiments, identity management module 1228 may control information about customers who wish to utilize the services provided by cloud infrastructure system 1202. Such information can include information that authenticates the identities of such customers and information that describes which actions those customers are authorized to perform relative to various system resources (e.g., files, directories, applications, communication ports, memory segments, etc.) Identity management module 1228 may also include the management of descriptive information about each customer and about how and by whom that descriptive information can be accessed and modified.

FIG. 13 illustrates an exemplary computer system 1300, in which various embodiments of the present invention may be implemented. The system 1300 may be used to implement any of the computer systems described above. For example, the computing system 100, the computing system 200, the client system 102, the image processing system 130, or a combination thereof can be included or implemented in the system 1300. The system 1300 can implement operations, methods, and/or processes (e.g., the process 1000 of FIG. 10). As shown in the figure, computer system 1300 includes a processing unit 1304 that communicates with a number of peripheral subsystems via a bus subsystem 1302. These peripheral subsystems may include a processing acceleration unit 1306, an I/O subsystem 1308, a storage subsystem 1318 and a communications subsystem 1324. Storage subsystem 1318 includes tangible computer-readable storage media 1322 and a system memory 1310.

Bus subsystem 1302 provides a mechanism for letting the various components and subsystems of computer system 1300 communicate with each other as intended. Although bus subsystem 1302 is shown schematically as a single bus, alternative embodiments of the bus subsystem may utilize multiple buses. Bus subsystem 1302 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1304, which can be implemented as one or more integrated circuits (e.g., a conventional microprocessor or microcontroller), controls the operation of computer system 1300. One or more processors may be included in processing unit 1304. These processors may include single core or multicore processors. In certain embodiments, processing unit 1304 may be implemented as one or more independent processing units 1332 and/or 1334 with single or multicore processors included in each processing unit. In other embodiments, processing unit 1304 may also be implemented as a quad-core processing unit formed by integrating two dual-core processors into a single chip.

In various embodiments, processing unit 1304 can execute a variety of programs in response to program code and can maintain multiple concurrently executing programs or processes. At any given time, some or all of the program code to be executed can be resident in processor(s) 1304 and/or in storage subsystem 1318. Through suitable programming, processor(s) 1304 can provide various functionalities described above. Computer system 1300 may additionally include a processing acceleration unit 1306, which can include a digital signal processor (DSP), a special-purpose processor, and/or the like.

I/O subsystem 1308 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1300 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1300 may comprise a storage subsystem 1318 that comprises software elements, shown as being currently located within a system memory 1310. System memory 1310 may store program instructions that are loadable and executable on processing unit 1304, as well as data generated during the execution of these programs.

Depending on the configuration and type of computer system 1300, system memory 1310 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1304. In some implementations, system memory 1310 may include multiple different types of memory, such as static random access memory (SRAM) or dynamic random access memory (DRAM). In some implementations, a basic input/output system (BIOS), containing the basic routines that help to transfer information between elements within computer system 1300, such as during start-up, may typically be stored in the ROM. By way of example, and not limitation, system memory 1310 also illustrates application programs 1312, which may include client applications, Web browsers, mid-tier applications, relational database management systems (RDBMS), etc., program data 1314, and an operating system 1316. By way of example, operating system 1316 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1318 may also provide a tangible computer-readable storage medium for storing the basic programming and data constructs that provide the functionality of some embodiments. Software (programs, code modules, instructions) that when executed by a processor provide the functionality described above may be stored in storage subsystem 1318. These software modules or instructions may be executed by processing unit 1304. Storage subsystem 1318 may also provide a repository for storing data used in accordance with the present invention.

Storage subsystem 1300 may also include a computer-readable storage media reader 1320 that can further be connected to computer-readable storage media 1322. Together and, optionally, in combination with system memory 1310, computer-readable storage media 1322 may comprehensively represent remote, local, fixed, and/or removable storage devices plus storage media for temporarily and/or more permanently containing, storing, transmitting, and retrieving computer-readable information.

Computer-readable storage media 1322 containing code, or portions of code, can also include any appropriate media known or used in the art, including storage media and communication media, such as but not limited to, volatile and non-volatile, removable and non-removable media implemented in any method or technology for storage and/or transmission of information. This can include tangible, non-transitory computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. When specified, this can also include nontangible, transitory computer-readable media, such as data signals, data transmissions, or any other medium which can be used to transmit the desired information and which can be accessed by computing system 1300.

By way of example, computer-readable storage media 1322 may include a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM, DVD, and Blu-Ray® disk, or other optical media. Computer-readable storage media 1322 may include, but is not limited to, Zip® drives, flash memory cards, universal serial bus (USB) flash drives, secure digital (SD) cards, DVD disks, digital video tape, and the like. Computer-readable storage media 1322 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1300.

Communications subsystem 1324 provides an interface to other computer systems and networks. Communications subsystem 1324 serves as an interface for receiving data from and transmitting data to other systems from computer system 1300. For example, communications subsystem 1324 may enable computer system 1300 to connect to one or more devices via the Internet. In some embodiments communications subsystem 1324 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1324 can provide wired network connectivity (e.g., Ethernet) in addition to or instead of a wireless interface.

In some embodiments, communications subsystem 1324 may also receive input communication in the form of structured and/or unstructured data feeds 1326, event streams 1328, event updates 1330, and the like on behalf of one or more users who may use computer system 1300.

By way of example, communications subsystem 1324 may be configured to receive data feeds 1326 in real-time from users of social media networks and/or other communication services such as Twitter® feeds, Facebook® updates, web feeds such as Rich Site Summary (RSS) feeds, and/or real-time updates from one or more third party information sources.

Additionally, communications subsystem 1324 may also be configured to receive data in the form of continuous data streams, which may include event streams 1328 of real-time events and/or event updates 1330, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1324 may also be configured to output the structured and/or unstructured data feeds 1326, event streams 1328, event updates 1330, and the like to one or more databases that may be in communication with one or more streaming data source computers coupled to computer system 1300.

Computer system 1300 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1300 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, a person of ordinary skill in the art will appreciate other ways and/or methods to implement the various embodiments.

In the foregoing specification, aspects of the invention are described with reference to specific embodiments thereof, but those skilled in the art will recognize that the invention is not limited thereto. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. One or more non-transitory computer-readable media storing instructions executable by one or more processors, the instructions comprising:
    instructions that cause the one or more processors to access a first electronic image of a subject to present in an application, wherein the application is associated with one or more criteria for presenting one or more electronic images in the application;
    instructions that cause the one or more processors to determine an adjustment to the first electronic image for presentation in the application, wherein the adjustment is determined based on the one or more criteria for presenting the one or more electronic images in the application;
    instructions that cause the one or more processors to generate, according to the adjustment, a second electronic image of the subject to present in the application; and
    instructions that cause the one or more processors to enable, based on operation of the application, a presentation of the second electronic image in the application.

2. The one or more non-transitory computer-readable media of claim 1, wherein the instructions further comprise:
    instructions that cause the one or more processors to receive a request to operate the application from a client device, wherein the adjustment is determined in response to receiving the request.

3. The one or more non-transitory computer-readable media of claim 1, wherein accessing the first electronic image includes receiving the first electronic image.

4. The one or more non-transitory computer-readable media of claim 1, wherein the one or more criteria includes a frame size for presenting the one or more electronic images in the application.

5. The one or more non-transitory computer-readable media of claim 1, wherein the one or more criteria includes a type of the application, a function of the application, a feature of the application, or a combination thereof.

6. The one or more non-transitory computer-readable media of claim 1, wherein the one or more criteria includes an aspect ratio for presenting the one or more electronic images in the application.

7. The one or more non-transitory computer-readable media of claim 1, wherein the one or more criteria includes a resolution for presenting the one or more electronic images in the application.

8. The one or more non-transitory computer-readable media of claim 1, wherein the subject is a first subject, wherein the adjustment is a first adjustment to the first electronic image determined for the first subject, and wherein the instructions further comprise:
    instructions that cause the one or more processors to identify a plurality of subjects in the first electronic image, the plurality of subjects including the first subject and a second subject;
    instructions that cause the one or more processors to determine, based on the one or more criteria, a second adjustment to the first electronic image for presentation in the application, wherein the second adjustment is determined for the second subject in the first electronic image; and
    instructions that cause the one or more processors to generate, according to the second adjustment to the first electronic image, a third electronic image of the second subject to present in the application.

9. The one or more non-transitory computer-readable media of claim 1, wherein the first electronic image has a first frame size, wherein the second electronic image has a second frame size, and wherein the second frame size is different from the first frame size.

10. The one or more non-transitory computer-readable media of claim 1, wherein the first electronic image has a first aspect ratio, wherein the second electronic image has a second aspect ratio, and wherein the second aspect ratio is different from the first aspect ratio.

11. The one or more non-transitory computer-readable media of claim 1, wherein generating the second electronic image includes cropping the first electronic image.

12. The one or more non-transitory computer-readable media of claim 1, wherein the instructions further comprise:
    instructions that cause the one or more processors to identify a portion of the first electronic image, the portion including the subject; and
    instructions that cause the one or more processors to crop the portion of the first electronic image, wherein the adjustment is determined using the cropped portion of the first electronic image, and wherein the second electronic image is generated using the cropped portion of the first electronic image.

13. The one or more non-transitory computer-readable media of claim 12, wherein the portion is identified using one or more image or object classifiers.

14. The one or more non-transitory computer-readable media of claim 1, wherein the first electronic image includes a plurality of subjects.

15. The one or more non-transitory computer-readable media of claim 1, wherein the subject is a person, an animal, a place, an object, or a combination thereof.

16. The one or more non-transitory computer-readable media of claim 1, wherein the instructions further comprise:
    instructions that cause the one or more processors to determine whether a frame size of the first electronic image is less than a frame size indicated by the one or more criteria, wherein, based on determining that the frame size of the first electronic image is less than the frame size indicated by the one or more criteria, the second electronic image is generated by padding the first electronic image.

17. The one or more non-transitory computer-readable media of claim 1, wherein the instructions further comprise:
   instructions that cause the one or more processors to determine whether a frame size of the first electronic image is greater than a frame size indicated by the one or more criteria,
   wherein, based on determining that the frame size of the first electronic image is less than the frame size indicated by the one or more criteria, the first electronic image is scaled down to have the frame size and an aspect ratio satisfying the one or more criteria.

18. The one or more non-transitory computer-readable media of claim 1, wherein the instructions further comprise:
   instructions that cause the one or more processors to store the second electronic image in a location that is remote from the application.

19. A method comprising:
   accessing, by a computer system, a first electronic image of a subject to present in an application, wherein the application is associated with one or more criteria for presenting one or more electronic images in the application;
   determining, by the computer system, an adjustment to the first electronic image for presentation in the application, wherein the adjustment is determined based on the one or more criteria for presenting the one or more electronic images in the application;
   generating, by the computer system, according to the adjustment, a second electronic image of the subject to present in the application; and
   based on operation of the application, enabling, by the computer system, a presentation of the second electronic image in the application.

20. A system comprising:
   one or more processors; and
   a memory accessible to the one or more processors, the memory storing one or more instructions that, upon execution by the one or more processors, causes the one or more processors to:
      access a first electronic image of a subject to present in an application, wherein the application is associated with one or more criteria for presenting one or more electronic images in the application;
      determine an adjustment to the first electronic image for presentation in the application, wherein the adjustment is determined based on the one or more criteria for presenting the one or more electronic images in the application;
      generate, according to the adjustment, a second electronic image of the subject to present in the application; and
      based on operation of the application, enable a presentation of the second electronic image in the application.

* * * * *

UNITED STATES PATENT AND TRADEMARK OFFICE
CERTIFICATE OF CORRECTION

PATENT NO. : 9,996,904 B2  
APPLICATION NO. : 15/476892  
DATED : June 12, 2018  
INVENTOR(S) : Goldberg et al.

Page 1 of 1

It is certified that error appears in the above-identified patent and that said Letters Patent is hereby corrected as shown below:

On the Title Page

Column 1, Item (*), under Notice, Line 3, delete "0 days. days." and insert -- 0 days. --, therefor.

In the Specification

In Column 17, Line 13, delete "indistguishable." and insert -- indistinguishable. --, therefor.

Signed and Sealed this  
Twenty-ninth Day of January, 2019

Andrei Iancu  
*Director of the United States Patent and Trademark Office*